United States Patent
Ryu et al.

(10) Patent No.: US 10,231,366 B2
(45) Date of Patent: Mar. 12, 2019

(54) ELECTRIC SHOCK PREVENTION APPARATUS

(71) Applicant: AMOTECH CO., LTD., Incheon (KR)

(72) Inventors: Jae Su Ryu, Seoul (KR); Yun Suk Choi, Incheon (KR); Yoon-Ho Hwang, Seoul (KR); Byung Guk Lim, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 0 days.

(21) Appl. No.: 15/771,671

(22) PCT Filed: Oct. 28, 2016

(86) PCT No.: PCT/KR2016/012225
§ 371 (c)(1),
(2) Date: Apr. 27, 2018

(87) PCT Pub. No.: WO2017/074088
PCT Pub. Date: May 4, 2017

(65) Prior Publication Data
US 2018/0324985 A1 Nov. 8, 2018

(30) Foreign Application Priority Data

Oct. 28, 2015 (KR) .................. 10-2015-0150487
Oct. 28, 2015 (KR) .................. 10-2015-0150490

(51) Int. Cl.
*G06F 1/16* (2006.01)
*H05K 9/00* (2006.01)
*H01C 7/12* (2006.01)

(52) U.S. Cl.
CPC ......... *H05K 9/0009* (2013.01); *G06F 1/1656* (2013.01); *H01C 7/12* (2013.01)

(58) Field of Classification Search
None
See application file for complete search history.

(56) References Cited

U.S. PATENT DOCUMENTS

2010/0109804 A1   5/2010   Feichtinger

FOREIGN PATENT DOCUMENTS

| JP | 2003-189596 | 7/2003 |
|----|-------------|--------|
| JP | 2010-146779 | 7/2010 |

(Continued)

OTHER PUBLICATIONS

International Search Report and Written Opinion issued in International Patent Application No. PCT/KR2016/012225, dated Feb. 10, 2017.

*Primary Examiner* — Xanthia C Cunningham
(74) *Attorney, Agent, or Firm* — Norton Rose Fulbright US LLP

(57) ABSTRACT

Provided is an electric shock protection apparatus. The electric shock protection apparatus, according to one exemplary embodiment of the present invention, comprises: a conductive connection part comprising an upper surface, which electrically comes into contact with a conductor of an electronic device, comprising an accommodation part containing a predetermined space formed at a lower part thereof, and having elastic force; a circuit board having a conductive connection part mounted therein; and an electric shock protection device mounted on the circuit board such that at least a portion of the electric shock protection device is disposed at the accommodation part, and blocking leakage current of an external power source which flows into a grounding part of the circuit board, wherein the circuit board comprises a pad and a wiring such that the conductive connection part and the electric shock protection device are electrically connected in series.

15 Claims, 16 Drawing Sheets

(56) References Cited

FOREIGN PATENT DOCUMENTS

| | | |
|---|---|---|
| KR | 1996-0002967 | 1/1996 |
| KR | 100573364 | 4/2006 |
| KR | 10-0617801 | 8/2006 |
| KR | 100713532 | 4/2007 |
| KR | 20070109332 | 11/2007 |
| KR | 10-2008-0040515 | 5/2008 |
| KR | 20100139075 | 12/2010 |
| KR | 10-2011-0051086 | 5/2011 |
| KR | 10-2013-0040698 | 4/2013 |

ELECTRIC SHOCK PREVENTION APPARATUS

CROSS-REFERENCE TO RELATED APPLICATIONS

This application is a national phase application under 35 U.S.C. § 371 of International Application No. PCT/KR2016/012225, filed Oct. 28, 2016, which claims priority to Korean Application No. 10-2015-0150487, filed Oct. 28, 2015, and Korean Application No. 10-2015-0150490, filed Oct. 28, 2015 The contents of the referenced applications are incorporated into the present application by reference.

FIELD OF THE DISCLOSURE

The present invention relates to an electric shock protection apparatus, and more particularly, to an electric shock protection apparatus capable of protecting a user from a leakage current by a power source with an electrical connection between a conductor and a circuit board.

DESCRIPTION OF RELATED ART

In line with miniaturization and multifunctional operation of recent portable electronic devices, various components and elements are densely arranged in the portable electronic devices. Thus, in order to reduce impact from the outside as well as electromagnetic waves penetrating into the portable electronic device or leaked from the portable electronic device, a conductive gasket is used between an external housing and a built-in circuit board of the portable electronic device.

Also, due to the multifunctional operation, the portable electronic device may include a plurality of antennas for each function, and at least a portion thereof, as a built-in antenna, may be disposed in the external housing of the portable electronic device. Thus, a conductive contactor for an electrical contact between the antenna disposed in the external housing and the built-in circuit board of the portable electronic device has been used.

Furthermore, with respect to the portable electronic device, the use of a metallic material housing tends to be increased recently in order to improve robustness and aesthetics.

As a result, an electrical path may be formed between the external housing and the built-in circuit board by the conductive gasket or the conductive contactor. In particular, since the metal housing and the circuit board form a loop, when the static electricity having a high voltage instantly flows through a conductor such as the metal housing having a large externally exposed area, static electricity may flow into the built-in circuit board through the conductive gasket or the conductive contactor to break a circuit, such as an integrated circuit (IC).

With respect to the portable electronic device, batteries are generally charged by using a charger. The charger rectifies external alternating current (AC) power into direct current (DC) power and then transforms the DC power into lower DC power suitable to the portable electronic device through a transformer. Herein, Y-CAPs composed of a capacitor are provided to both ends of the transformer in order to enhance electrical insulation of the transformer.

However, in a case in which the Y-CAP does not have regular features as in a non-genuine charger, the DC power may not be sufficiently blocked by the Y-CAP, furthermore, a leakage current may occur due to the AC power, and the leakage current may flow through the ground of the circuit.

Since the leakage current may be transferred to a conductor contactable with the human body, e.g., an external case of the portable electronic device, a user may experience a prickling discomfort, and in a severe case, an electric shock accident may occur in which the user may suffer injury.

Thus, there is a need to provide a protective element for protecting the user from the leakage current to the conductive gasket or the conductive contactor connecting the metal housing and the circuit board.

Furthermore, in a case in which the metal housing is used as an antenna, since a signal may be attenuated when the conductive gasket or the conductive contactor has low capacitance, the radio frequency (RF) signal may not be smoothly transmitted. Thus, there is a need to obtain high capacitance.

Thus, in line with the use of the conductor such as the metal case, there is a need to develop a contactor having various functions for protecting the user or the circuit in the portable electronic device as well as a simple electrical contact.

However, since additional components and elements are required for implementing these various functions and accordingly, an additional space in the circuit board of the portable electronic device must be secured, this may adversely affect the miniaturization of the portable electronic device.

SUMMARY OF THE INVENTION

An object of the present invention is to provide an electric shock protection apparatus capable of protecting a user or an internal circuit from a leakage current due to an external power source and efficiently utilizing a mounting space of a circuit board.

According to an embodiment of the present invention, there is provided an electric shock protection apparatus including: a conductive connection part having elastic force comprising an accommodation part which an upper surface is in electrical contact with a conductor of an electronic device and in which a predetermined space is formed at a lower portion; a circuit board on which the conductive connection part is mounted; and an electric shock protection device mounted on the circuit board such that at least a portion of the electric shock protection device is disposed at the accommodation part, and blocking a leakage current of an external power source that flows from a ground of the circuit board of the electronic device. The circuit board may include a pad and a wiring such that the conductive connection part and the electric shock protection device are electrically connected in series.

According to a preferred embodiment of the present invention, the electric shock protection device may pass a communication signal flowing from the conductor or may pass the static electricity without a dielectric breakdown when the static electricity flows from the conductor.

As another embodiment, the accommodation part may be provided in any one of a shape of a letter "⊏", a shape of a letter "E", and a shape of a letter "⊡" on a lower surface of the conductive connection part.

As another embodiment, the accommodation part may be provided in a shape of a letter "⊡" on a lower surface of the conductive connection part, and may include an connection part in which a side of the shape of the letter "⊡" extends to the electric shock protection device.

As another embodiment, the accommodation part may be formed between a plurality of supporting parts extending vertically from a lower surface of the conductive connection part.

In addition, the conductive connection part may share a space three-dimensionally with elastic members having at least two different elastic forces.

In this case, the conductive connection part may include a body including an elastic member having a spiral shape; a cover part including a contact part formed on the upper side of the body; and a supporting part extending vertically from the body and forming a side wall of the accommodation part.

In addition, the spiral shape may be formed by one of folding, rolling, and winding.

In addition, the supporting part may be provided in any one of a shape of a letter "⊏", a shape of a letter "E", and a shape of a letter "⊡" on a lower surface of the conductive connection part.

As another embodiment, the supporting part may be provided in a shape of a letter "⊡" on a lower surface of the conductive connection part, and may include an connection part in which a side of the shape of the letter "⊡" extends to the electric shock protection device.

As another embodiment, the supporting part may be respectively separated from a plurality of positions on the lower surface of the body and may vertically extend.

In addition, the electric shock protection device may include an electric shock protection part and at least one capacitor layer, and the electric shock protection part may have a breakdown voltage Vbr satisfying the following equation.

Vbr>Vin, Vcp>Vbr wherein, Vin may be a rated voltage of an external power source of the electronic device, and Vcp may be a total dielectric breakdown voltage of the capacitor layer.

As an embodiment, the electric shock protection device may include a sintered body in which a plurality of sheet layers are stacked; an electric shock protection part including at least a pair of internal electrodes spaced apart from each other at a predetermined interval in inside of the sintered body; and at least one capacitor layer electrically connected in parallel with the electric shock protection part and passing a communication signal flowing from the conductor.

As another embodiment, the electric shock protection device may include an electric shock protection part including at least two varistor material layers in which a first varistor material layer and a second varistor material layer are stacked, a plurality of first internal electrodes spaced apart by a predetermined interval L on the first varistor material layer, a plurality of second internal electrodes spaced apart by a predetermined interval L on the second varistor material layer; and at least one laminated capacitor layer electrically connected in parallel with the electric shock protection part and passing a communication signal.

In addition, the conductive connection part may be any one of a conductive gasket, a silicone rubber pad, and a clip-shaped conductor having elastic force.

An electric shock protection apparatus and a portable electronic device having thereof according to an embodiment of the present invention, since a contactor for connecting a conductor and a circuit board and an electric shock protection apparatus are stacked in a portable electronic device in which a conductor such as a metal case is exposed to the outside, may prevent damage to the user such as electric shock through the conductor or damage to the internal circuit.

In addition, the present invention minimizes an additional space for mounting two components on a circuit board by double stacking an electric shock protection device and a contactor, thereby may be suitable for miniaturization of the portable electronic device.

DETAILED DESCRIPTION OF THE INVENTION

Figure 1:
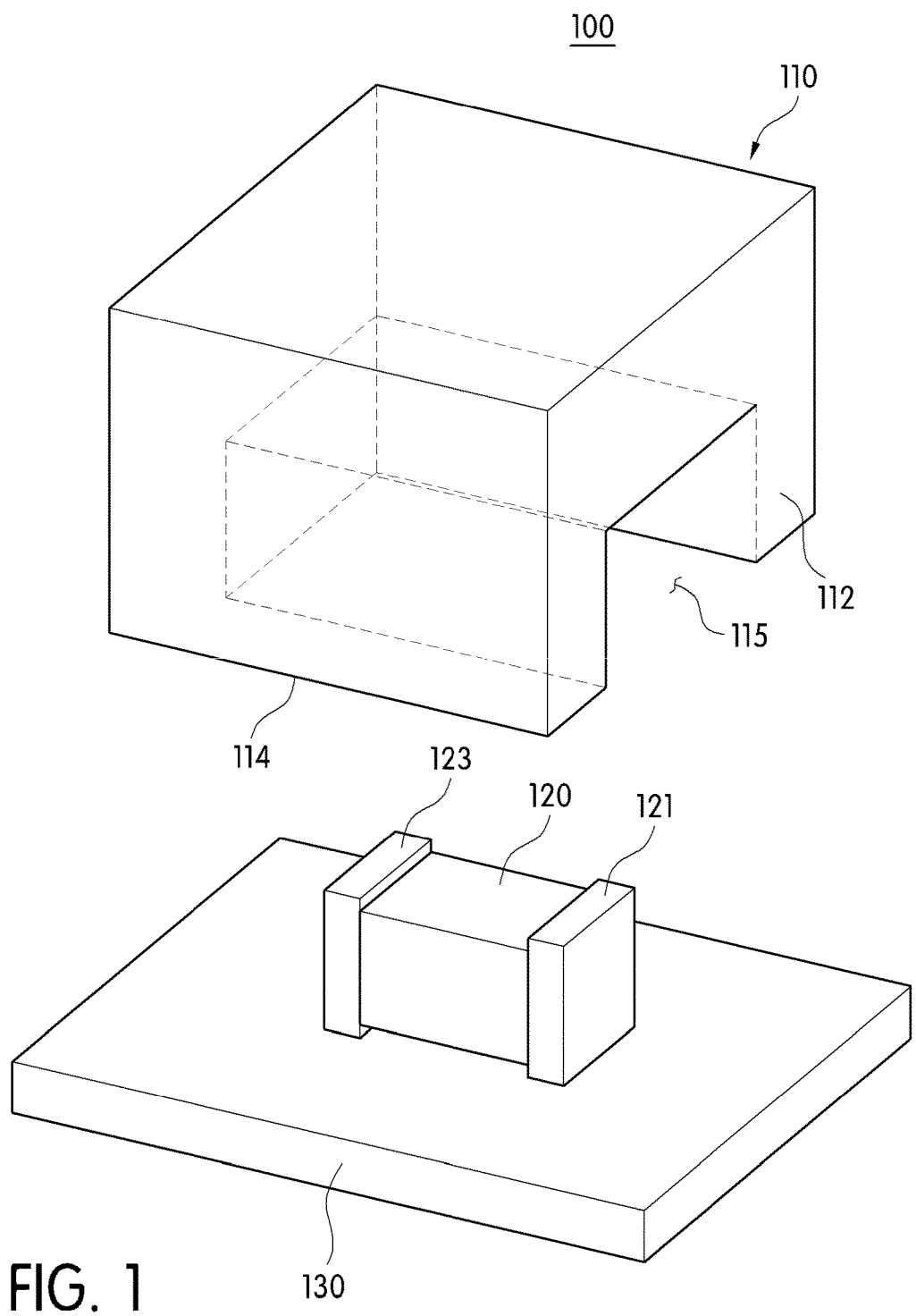
FIG. 1 is a perspective view illustrating an electric shock protection apparatus according to an embodiment of the present invention.

Hereinafter, embodiments of the present disclosure will be described in detail with reference to the accompanying drawings so that those skilled in the art can easily carry out the present disclosure. The present disclosure may be embodied in various ways and is not limited to the embodiments described herein. In the drawings, parts not relating to the description may be omitted for clarifying the present disclosure, and the same reference numerals may be assigned to the same or similar components throughout the specification.

An electric shock protection apparatus 100 according to an embodiment of the present invention comprises a conductive connection part 110, an electric shock protection device 120, and a circuit board 130.

Such an electric shock protection apparatus 100 is for electrically connecting a human-contactable conductor such as an external metal case and a circuit board of a portable electronic device, in the portable electronic device.

Here, the portable electronic device may be in the form of a portable electronic device that is portable and easy to carry. For example, the portable electronic device may be a portable terminal such as a smart phone, a cellular phone, or the like, and may be a smart watch, a digital camera, digital multimedia broadcasting (DMB), an electronic book, a netbook, a tablet PC, or the like. Such electronic devices may be provided with any suitable electronic components including antenna structures for communication with external devices. In addition, the electronic devices may be devices using a local area network communication such as Wi-Fi or Bluetooth.

The conductive connection part 110 may be pressed in response to a pressing force to couple a conductor to the portable electronic device, and may have an elastic force so that it can be restored to an original state when the conductor is released from the portable electronic device.

Here, the conductor may be provided to partially surround or entirely surround the side of the portable electronic device, and may be an antenna for communication between the portable electronic device and the external device.

Figure 24:
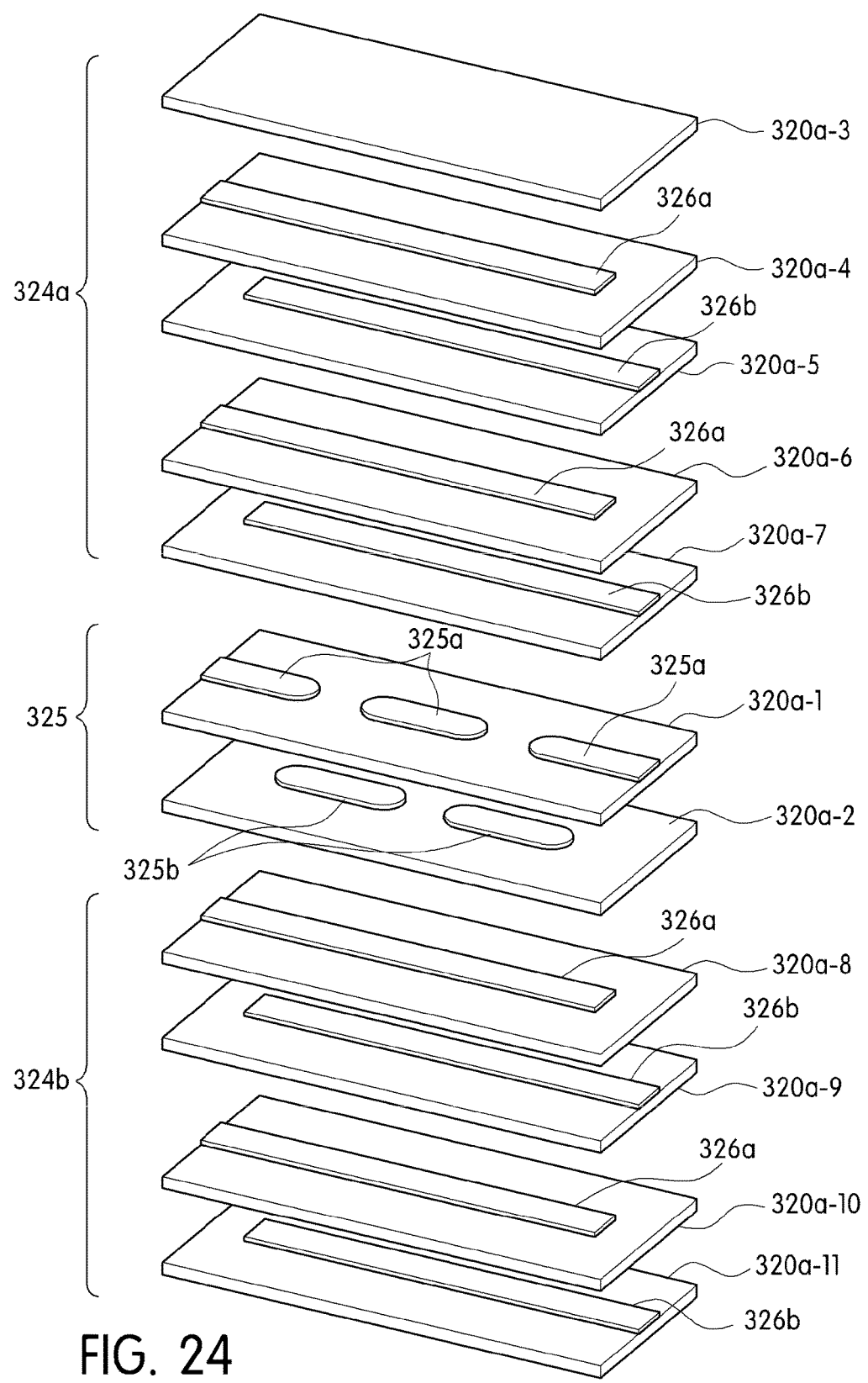
FIG. 24 is an exploded perspective view illustrating a stacking relationship of a plurality of sheet layers in FIG. 23.
Figure 25:
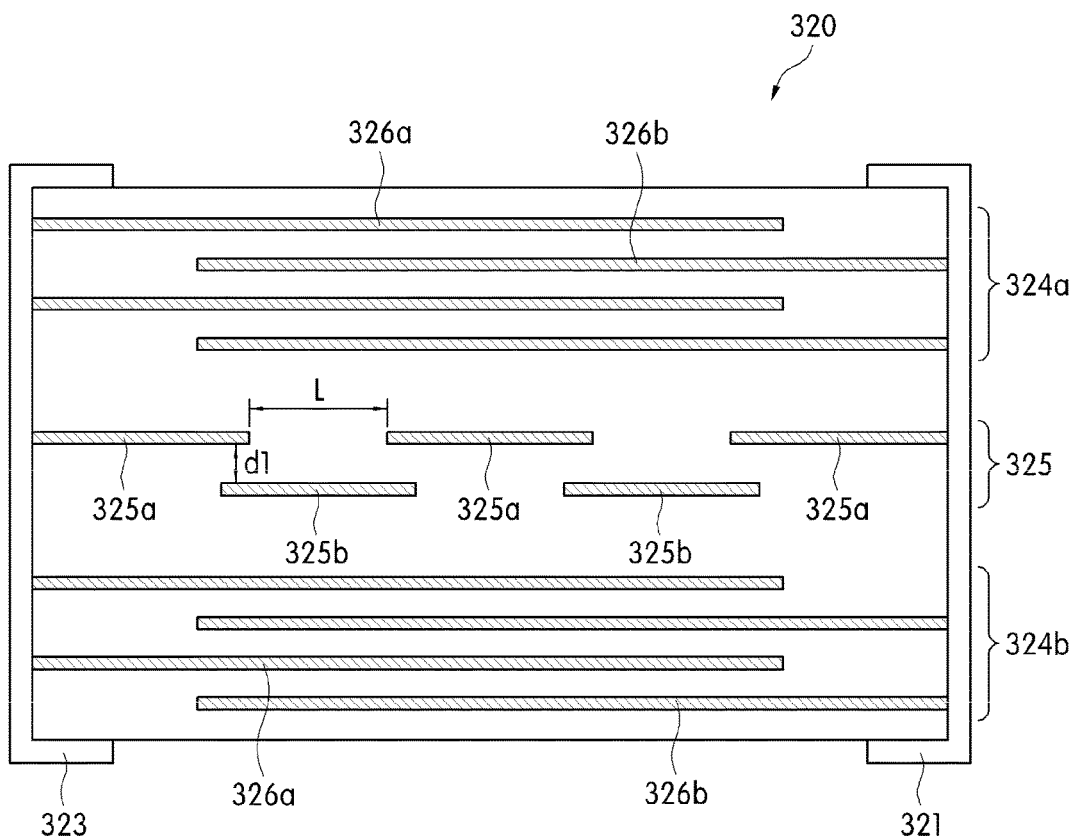
FIG. 25 is a longitudinal sectional view illustrating an electric shock protection device in FIG. 23, and FIGS. 26 to 29 are sectional views illustrating various forms of a conductive connection part of an electric shock protection apparatus according to an embodiment of the present invention.
Figure 26:
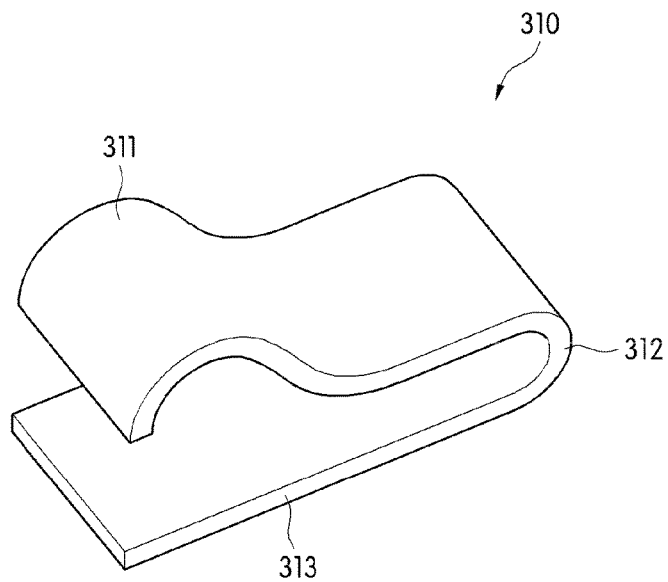
Figure 27:
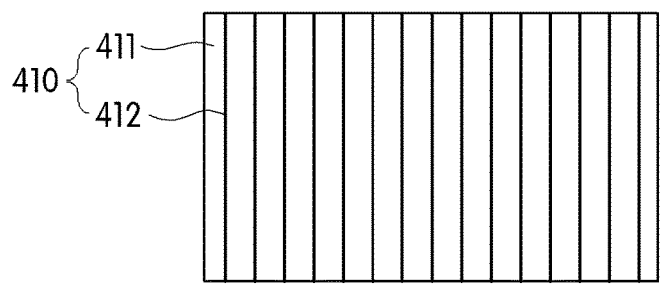

The conductive connection 110 may have an upper surface that is in electrical contact with the conductor of the portable electronic device, and the conductive connection 110 may have an elastic force. As illustrated in FIG. 24, such a conductive connection part 110 may be a clip-shaped conductor having an elastic force as shown in FIG. 24, or may be a conductive gasket or a silicone rubber pad as illustrated in FIGS. 25 to 27.

Here, when the conductive connection part 110 is in surface contact with a conductor such as a conductive gasket or a silicone rubber pad, the conductive connection part 110 may be integrally formed of a conductive material having an elastic force. In this case, the conductive connection part 110 can be retracted toward the circuit board by the pressing force of the conductor 12 and can be restored to an original state of the conductive connection part 110 by the elastic force when the conductor 12 is separated from the portable electronic device.

In addition, when the conductive connection part 110 contacts the conductor 12 like a clip-shaped conductor 310 having an elastic force, in the conductive connection part 310, as a contact part 311 is pressed by the circuit board, a bent part 312 having an elastic force may be pressed toward the circuit board, and when the conductor is separated from the portable electronic device, the conductive connection part 310 may be restored to the original state of the conductive connection part 310 by the elastic force of the bent part 312, that is, to the upper side of the mounting portion of the circuit board.

As illustrated in FIG. 1, such a conductive connection part 110 may be provided with an accommodation part 115 that upper surface is in electrical contact with a conductor of the portable electronic device and in which a predetermined space is formed at a lower portion thereof. Here, the accommodation part 115 is for double laminating the conductive connection part 110 and the electric shock protection device 120 on the circuit board 130, and accommodates at least a portion of the electric shock protection device 120.

In this case, the conductive connection part 110 may include the accommodation part 115 variously according to a double stacked structure with the electric shock protection device 120.

Figure 2:
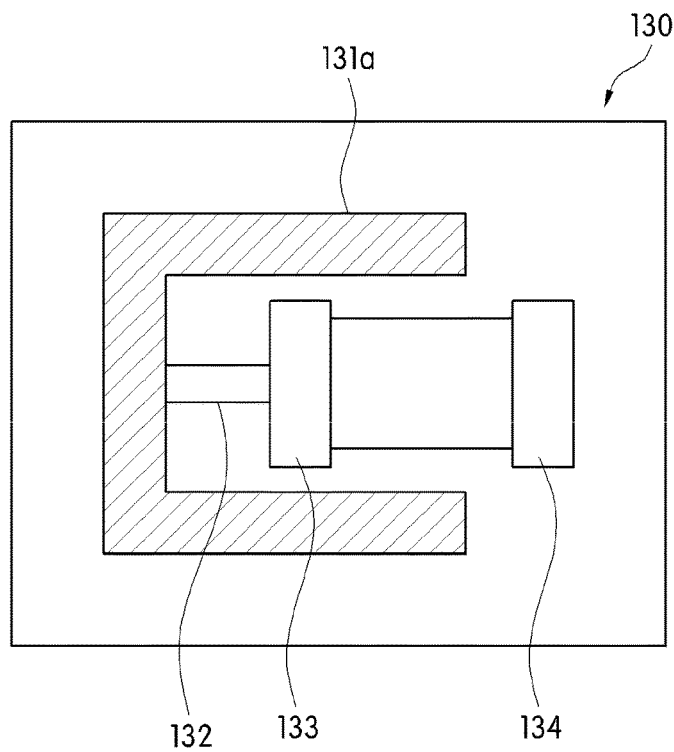
FIG. 2 is a plan view illustrating a circuit board, in which a lower surface of an electric shock protection apparatus according to an embodiment of the present invention is in the shape of a letter "⊏" shape.

For example, as illustrated in FIG. 2, the accommodation part 115 may be provided in a shape of a letter "⊏" at a lower portion of the conductive connection part 110. That is, a side wall of the accommodation part 115 may be formed by a supporting part 112 extending vertically in a shape of a letter "⊏" at the lower portion of the conductive connection part 110. Here, as illustrated in FIG. 2, the lower surface 114 of the conductive connection part 110 may be provided in a shape of a letter "⊏" and be mounted on the circuit board 130.

In FIG. 2, the electric shock protection device 120 is illustrated and described as being mounted on the circuit board 130 such that only a portion of the electric shock protection device 120 is disposed in the accommodation part 115 having a shape of a letter "⊏", but it is not limited thereto, the entirety of the electric shock protection device 120 may be configured to be disposed in the accommodating part 115 having a shape of the letter "⊏" in accordance with the size of the conductive connection part 110 or the electric shock protection device 120.

In this case, the circuit board 130 may be provided with a pad 131a for the conductive connection part having a shape of a letter "⊏" which configured to mount the conductive connection part 110, a pad 133 and 134 for the electric shock protection device which configured to mount the electric shock protection device 120, and a wiring 132 configured to connect between the pad 131a and the pad 133 and 134.

Figure 3:
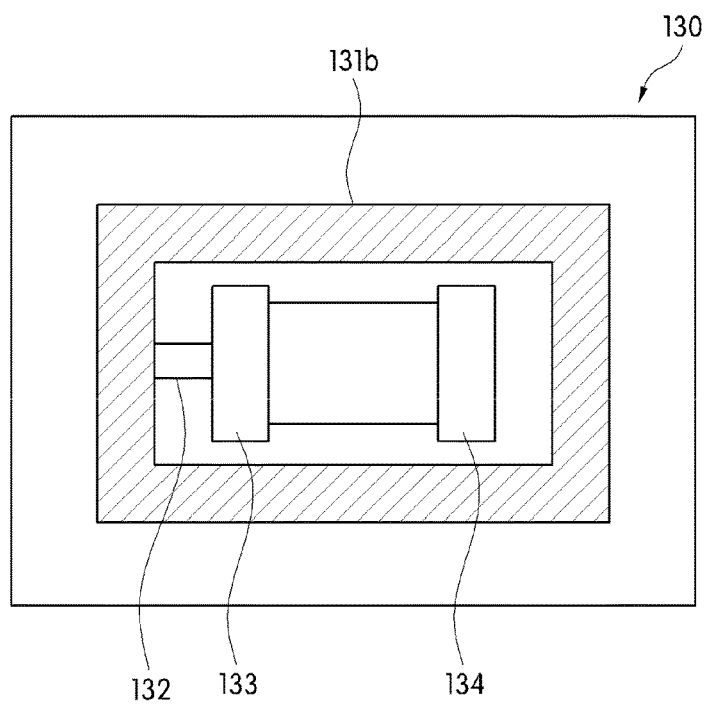
FIG. 3 is a plan view illustrating a circuit board, in which a lower surface of an electric shock protection apparatus according to an embodiment of the present invention is in the shape of a letter "⊡" shape.

In addition, the accommodation part 115 may be provided in a shape of a letter "ロ" in a lower portion of the conductive connection part 110. That is, a side wall of accommodation part 115 may be formed by a supporting part 112 extending vertically a shape of a letter "ロ" at the lower portion of the conductive connection part 110. In this case, as illustrated in FIG. 3, a lower surface 114 of the conductive connection part 110 may be provided in a shape of a letter "ロ", and be mounted on the circuit board 130.

In this case, the circuit board 130 may include a pad 131b for the conductive connection part having a shape of a letter "ロ" which configured to mount the conductive connection part 110, a pad 133 and 134 for the electric shock protection device which configured to mount the electric shock protection device 120, and a wiring 132 configured to connect between the pad 131b and the pad 133 and 134.

With this configuration, the conductive connection part 110 and the electric shock protection device 120 may be double stacked on the circuit board 130 without a separate space for the electric shock protection device 120 to be miniaturized.

Figure 4:
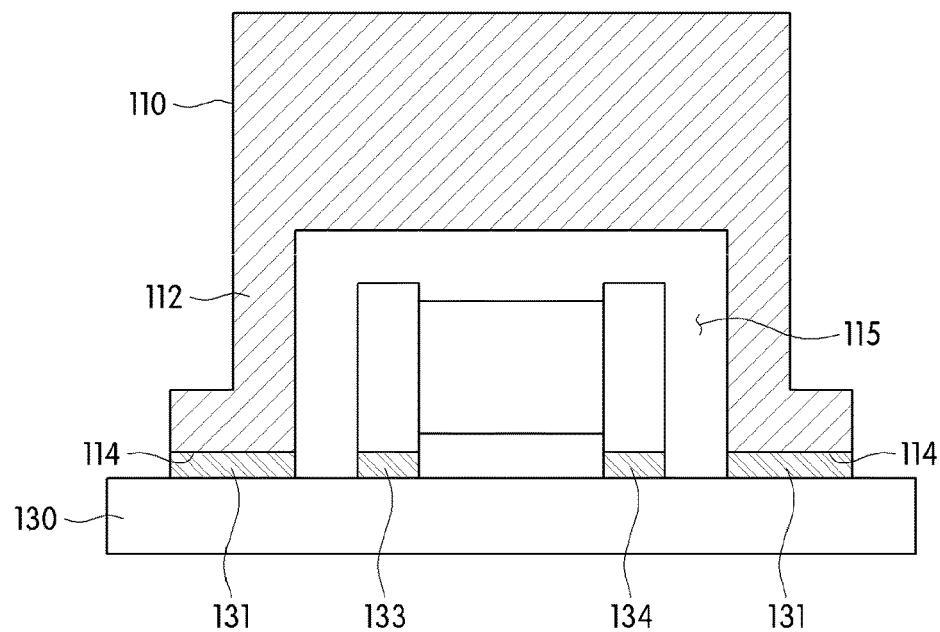
FIG. 4 is a cross-sectional view illustrating an electric shock protection apparatus according to an embodiment of the present invention, in which an electric shock protection apparatus is double-stacked inside a contactor.

Meanwhile, as illustrated in FIG. 4, regardless of the shape of the accommodation part 115, when the electric shock protection device 120 is completely stacked with the conductive connection part 110, the electric shock protection device 120 may be disposed in the accommodation part 115.

Figure 5:
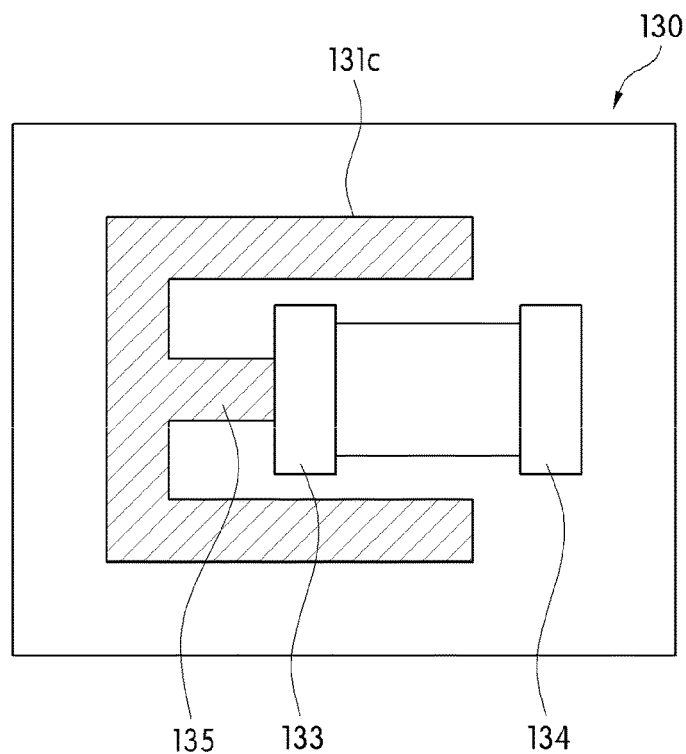
FIG. 5 is a plan view illustrating a circuit board in which a lower surface of an electric shock protection apparatus according to an embodiment of the present invention is in the shape of a letter "E" shape.
Figure 6:
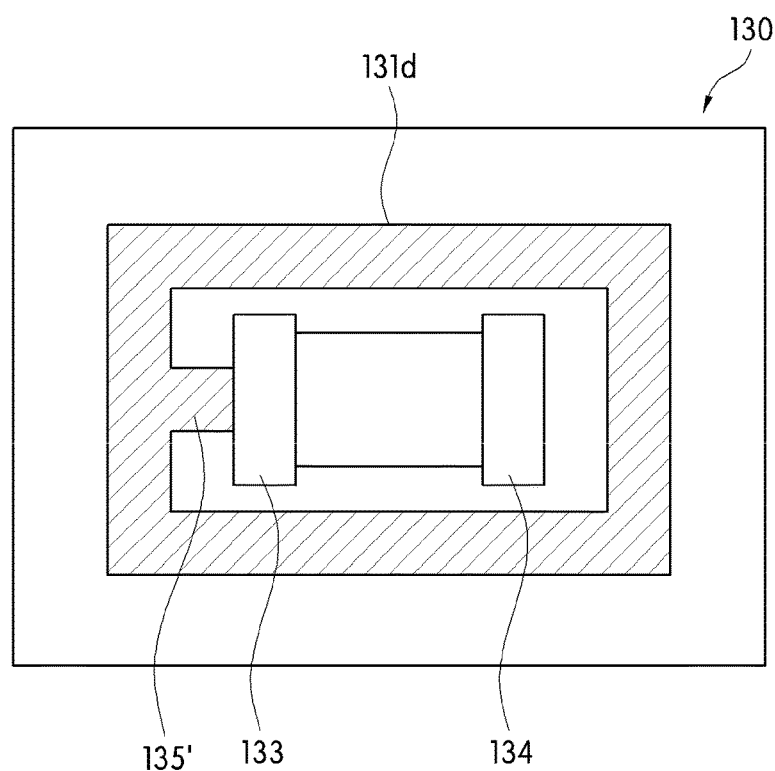
FIG. 6 is a plan view illustrating a circuit board, in which a lower surface of an electric shock protection apparatus according to an embodiment of the present invention is in the shape of a letter "⊡" and one of the sides extends to an electric shock protection device.

In addition, the accommodation part 115 may be provided in a shape of a letter "E" in a lower portion of the conductive connection part 110. That is, a side wall of accommodation part 115 may be formed by a supporting part 112 extending vertically a shape of a letter "E" at the lower portion of the conductive connection part 110. In this case, an extension part 135 may be formed from a side of the supporting part 112 to the electric shock protection device 120. Here, as illustrated in FIG. 5, a lower surface 114 of the conductive connection part 110 may be provided in a shape of a letter "E", and be mounted on the circuit board 130.

In this case, the circuit board 130 may be provided with a pad 131c and 135 for the conductive connection part having a shape of a letter "E" which configured to mount the conductive connection part 110, a pad 133 and 134 for the electric shock protection device which configured to mount the electric shock protection device 120. Here, the pad 135 corresponds to an extension part formed from the conductive connection part 110 to the electric shock protection device 120.

In addition, the accommodation part 115 may be provided in a shape of a letter "ロ" at a lower portion of the conductive connection part 110, and an connection part 135 may be provided in which a side of the shape of the letter "ロ" extends to the electric shock protection device 120. That is, a side wall of the accommodation part 115 may be formed by a supporting part 112 extending vertically in a shape of a letter "ロ" at the lower portion of the conductive connection part 110, an extension part extended from a side of the side wall to the electric shock protection device 120 may be formed. Such an extension part may be provided to be electrically connected to the electric shock protection device 120. Here, a lower surface 114 of the conductive connection part 110, as illustrated in FIG. 5, may be formed in a shape of a letter "ロ", and may be mounted on the circuit board 130.

In the case, the circuit board 130 may be provided with a pad 131c and 135' for the conductive connection part having a shape of a letter "ロ" which configured to mount the conductive connection part 110, a pad 133 and 134 for the electric shock protection device which configured to mount the electric shock protection device 120. Here, the pad 135' corresponds to an extension part formed from the conductive connection part 110 to the electric shock protection device 120.

Figure 7:
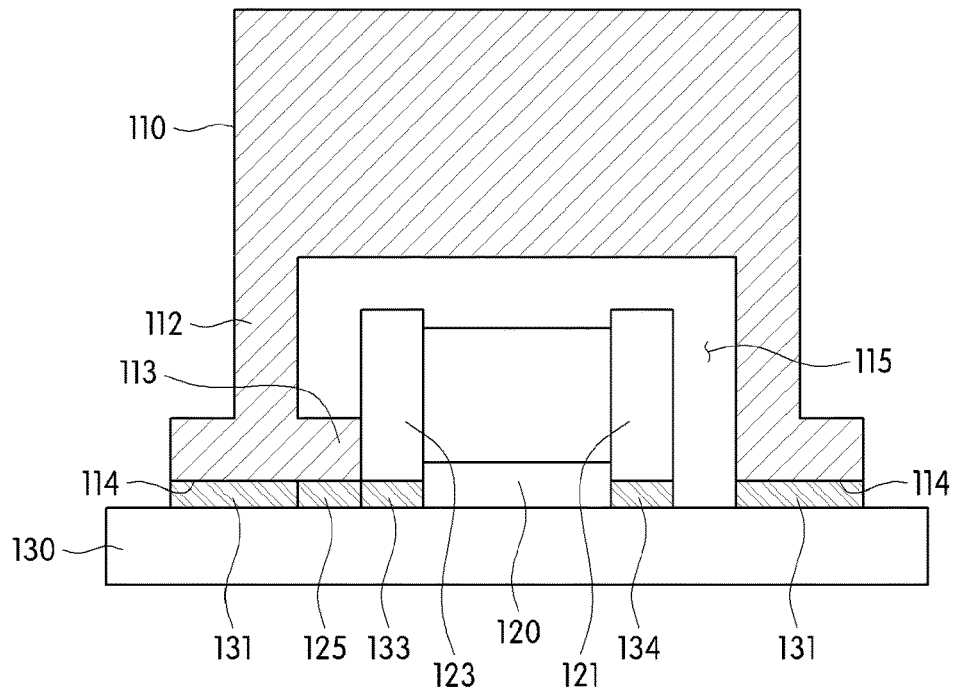
FIG. 7 is a cross-sectional view illustrating an electric shock protection apparatus according to an embodiment of the present invention, in which an electric shock protection device is double-stacked inside a contactor, and an electric shock protection device and a contactor are coupled.

Meanwhile, as illustrated in FIG. 7, regardless of the shape of the accommodation part 115, when an extension part 113 is formed from the conductive connection part 110 to the electric shock protection device 120 and the electric shock protection device 120 is completely stacked with the conductive connection part 110, the conductive connection part 110 and the electric shock protection device 120 may be connected, and the electric shock protection device 120 may be disposed in the accommodation part 115. In this case, the connection part 113 may be provided to face one of the external electrodes 123 of the electric shock protection device 120.

Figure 8:
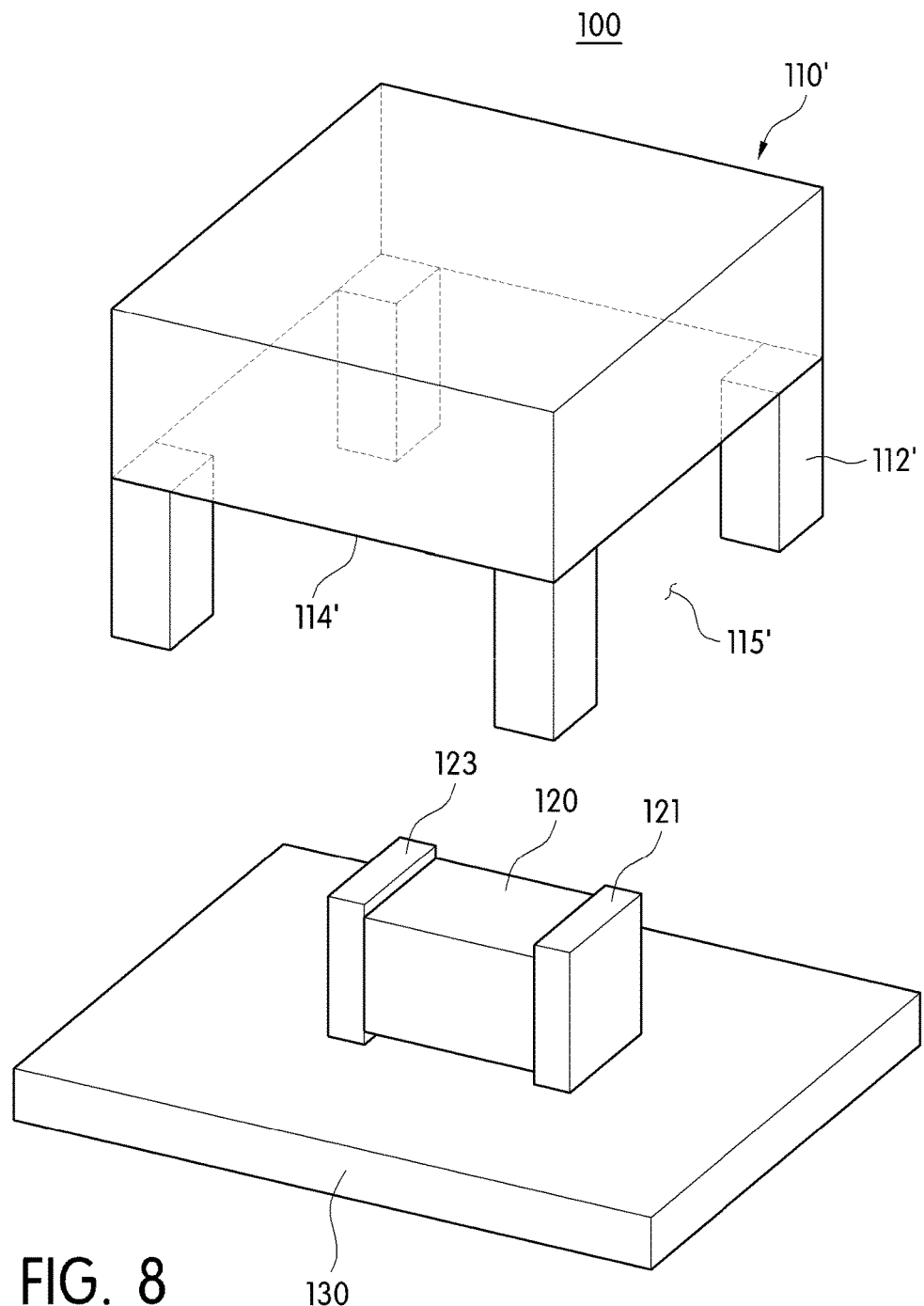
FIG. 8 is a perspective view illustrating an electric shock protection apparatus according to an embodiment of the present invention, in which a plurality of independent supporting parts are formed on a lower surface of a contactor.

In addition, the accommodation part 115 may be formed between a plurality of supporting parts 112' extending vertically from a lower surface 114' of the conductive connection part 110. That is, as illustrated in FIG. 8, the conductive connection part 110 may be configured to have a table shape including four legs. Here, the electric shock protection device 120 may be disposed in accommodation part 115' in four supporting parts 112', or at least a portion thereof may be disposed to protrude outward between any two supporting parts 112'.

With this configuration, the degree of disposition freedom for double lamination between the conductive connection part 110 and the electric shock protection device 120 may be improved.

Figure 9:
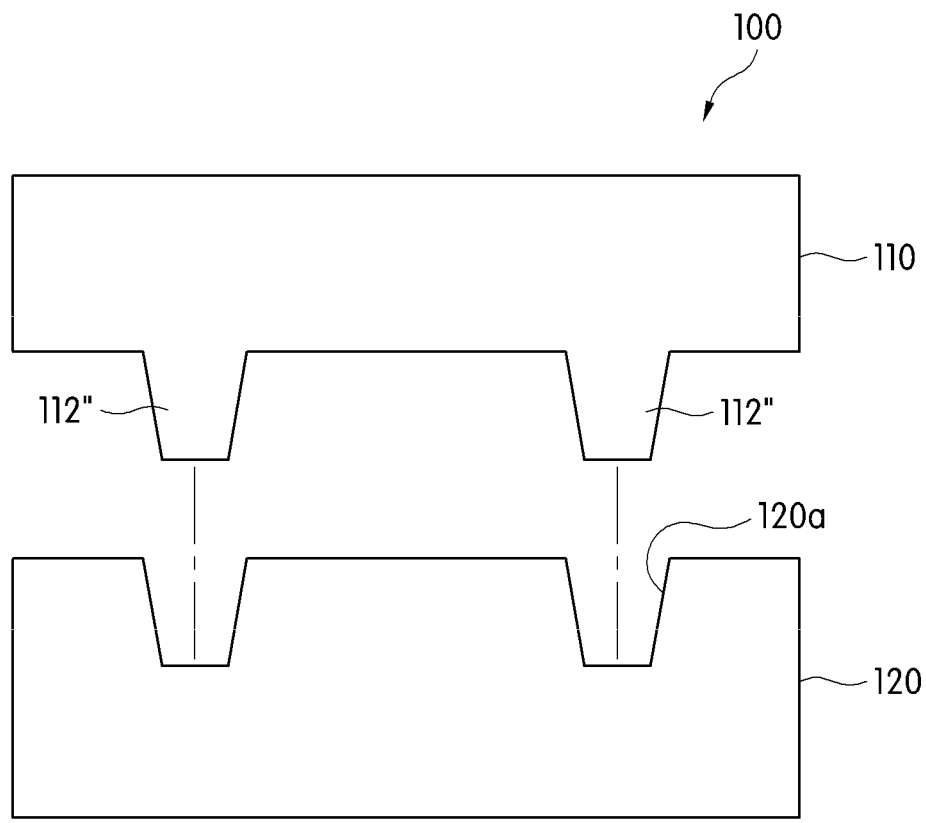
FIG. 9 is a cross-sectional view illustrating an electric shock protection apparatus according to an embodiment of the present invention, in which a contactor is stacked on an upper side of an electric shock protection device.

Meanwhile, as illustrated in FIG. 9, to double stack the conductive connection part 110 and the electric shock protection device 120 in the same space on the circuit board 130, the conductive connection part 110 may be directly stacked on the upper side of the electric shock protection device 120.

In this case, the conductive connection part 110 may be provided with a supporting part 112" protruding from a lower surface 114" thereof and a groove part 120a corresponding to the supporting part 112" may be provided on the upper surface of the electric shock protection device 120.

Here, the supporting part 112" and the groove part 120a may be formed in a trapezoidal shape so as to facilitate the coupling, but it is not limited thereto and may be formed in various forms. In this case, an external electrode of the electric shock protection device 120 may be formed on the bottom surface of a groove part 120a so as to electrically connect the conductive connection part 110 and the electric shock protection device 120 in series.

Meanwhile, in FIG. 1, the conductive connection part 110 and the electric shock protection device 120 are illustrated to be spaced apart from each other, but it is not limited thereto, may be configured to contact each other in the vertical direction. For example, it may be configured such that the external electrodes 121 and 123 of the electric shock protection device 120 are vertically disposed and the conductive connection part 110 has an extension part on at least one side of the conductive connection part 110, and it is disposed so that one side of the conductive connection part 110 is in contact with one of the external electrodes formed on the upper side of the electric shock protection device 120.

The electric shock protection device 120 may be electrically connected to the conductive connection part 110 through the circuit board 130 in series, and may be disposed so that at least a portion of the electric shock protection device 120 is stacked in the accommodation part 115 of the conductive connection part 110. The electric shock protection device 120 may be a suppressor or a varistor, including a capacitor layer.

Here, the electric shock protection device 120 may have a breakdown voltage Vbr that satisfies the flowing equation so as to block the leakage current of the external power source flowing from the ground of a circuit part 14, allow the static electricity (or electrostatic discharge, ESD) to pass without dielectric breakdown when the static electricity flows from a conductor 12, and allow a communication signal flowing from the conductor 12 to pass:

$$Vbr>Vin, Vcp>Vbr$$

Here, Vin is the rated voltage of the external power source of the electronic device, and Vcp is the total dielectric breakdown voltage of the capacitor layer.

Here, the total dielectric breakdown voltage of the capacitor layer is such that the capacitor layers 224a and 224b are comprised of a plurality of layers and are electrically connected in parallel so that may be the same as the dielectric breakdown voltage across each capacitor formed by the capacitor electrodes 226a and 226b.

In this case, the rated voltage may be a national standard rated voltage, for example, may be any one of 240V, 110V, 220V, 120V, and 100V.

Figure 10:
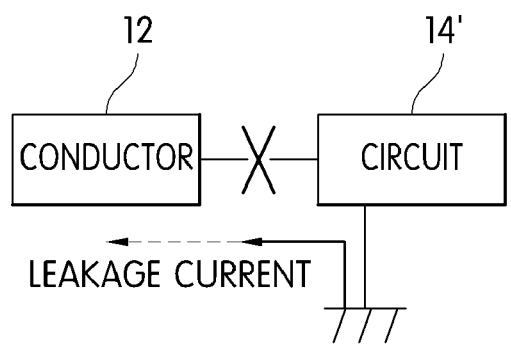
FIG. 10 is a schematic equivalent circuit view for explaining an operation of a leakage current, in a case in which an electric shock protection apparatus according to an embodiment of the present invention is installed in a portable electronic device.
Figure 11:
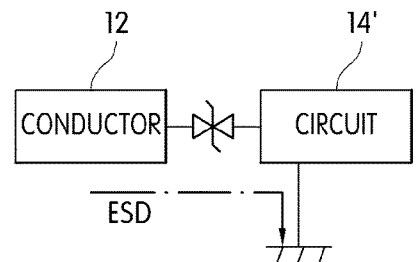
FIG. 11 is a schematic equivalent circuit view for explaining an operation of an electrostatic discharge (ESD), in a case in which an electric shock protection apparatus according to an embodiment of the present invention is installed in a portable electronic device.
Figure 12:
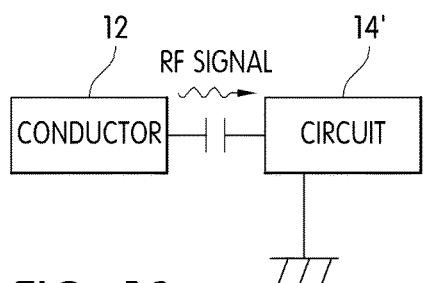
FIG. 12 is a schematic equivalent circuit view for explaining an operation of a communication signal, in a case in which an electric shock protection apparatus according to an embodiment of the present invention is installed in a portable electronic device.

As illustrated in FIGS. 10 to 12, the electric shock protection device 120 may have different functions depending on a leakage current due to an external power source, a static electricity flowing from the conductor 12, and a communication signal.

That is, as illustrated in FIG. 10, the mounted circuit part 14 of the circuit board 130, for example, when the leakage current of the external power source flows into the conductor 12 through the ground, since a breakdown voltage (or a trigger voltage) Vbr of the electric shock protection device 120 is larger than the overvoltage due to the leakage current, the electric shock protection device 120 may be maintained an open state. That is, since the breakdown voltage Vbr of the electric shock protection device 120 is larger than a rated voltage of an external power source of a portable electronic device, it is possible to prevent leakage current from being transmitted to the conductor 12 which can be bonded to the human body such as a metal case by maintaining the open state without being electrically conducted.

In this case, the capacitor layer may block the DC component contained in the leakage current, since the leakage current has a relatively low frequency as compared with that of the wireless communication band, the capacitor layer may block the leakage current by acting as a large impedance with respect to the frequency.

As a result, the electric shock protection device 120 may protect the user from electric shock. by blocking a leakage current of an external power source flowing from the ground of the circuit part 14.

In addition, as illustrated in FIG. 11, when static electricity flows from the outside through the conductor 12, the electric shock protection device 120 functions as an electrostatic protection device such as a suppressor or a varistor. That is, the electric shock protection device 120 may pass the static electricity by the instantaneous discharge because the operation voltage of the suppressor for electrostatic discharge or a varistor voltage (or a breakdown voltage) of the varistor is smaller than the instantaneous voltage of the static electricity. As a result, when the static electricity flows from the conductor 12 through the conductive connection part 110 to the electric shock protection device 120, the electric shock protection device 120 has a low electrical resistance, so that may pass static electricity without itself being broken down.

In this case, since the total dielectric breakdown voltage Vcp of the capacitor layer is larger than the breakdown voltage Vbr of the electric shock protection part, the static electricity does not flow into the capacitor layer but may be passed only through the electric shock protection part.

Here, the circuit part 14 may be provided with a separate protective element for bypassing the static electricity to the ground. As a result, the electric shock protection device 120 may protect the internal circuit of the rear end thereof by passing static electricity without being broken down by the static electricity flowing through the conductive connection part 110 from the conductor 12.

In addition, as illustrated in FIG. 12, when a communication signal is input from the conductor 12 through the conductive connection part 110 to the electric shock protection device 120, the electric shock protection device 120 functions as a capacitor. That is, the electric shock protection device 120 may maintain the electric shock protection part as open state so as to shut off the conductor 12 and the circuit part 14, but the internal capacitor layer thereof may pass the incoming communication signal. As described above, the capacitor layer of the electric shock protection device 120 may provide an inflow route for the communication signal.

Figure 13:
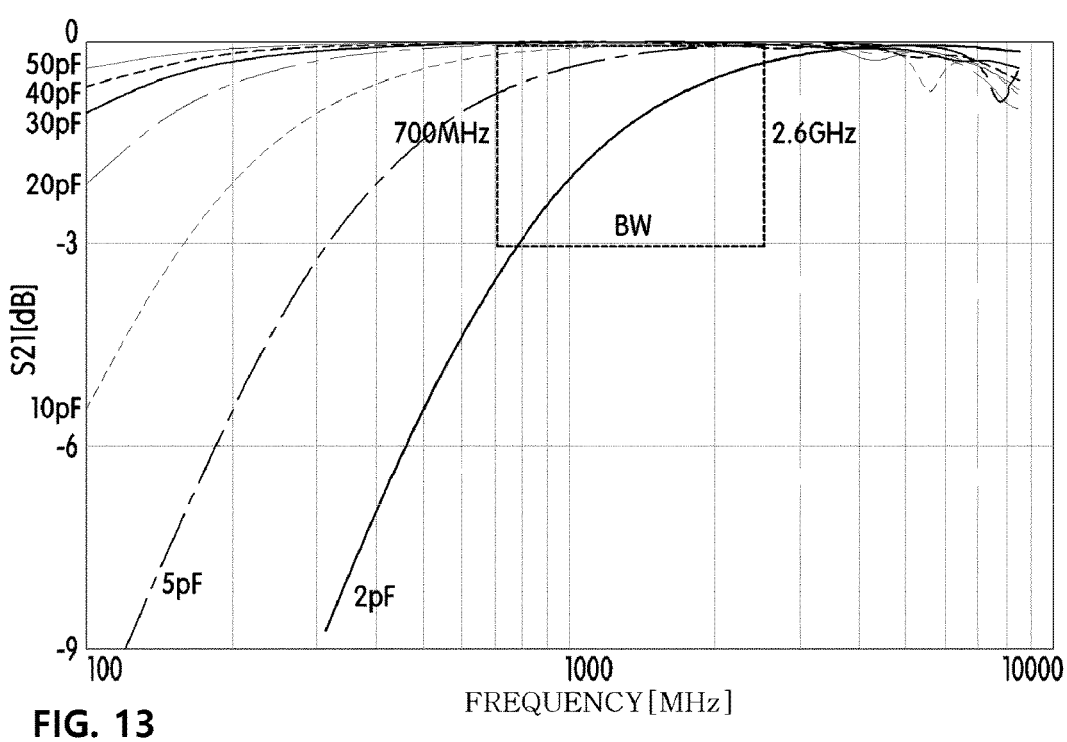
FIG. 13 is a graph illustrating a simulation result of a pass frequency band according to a capacitance.
Figure 14:
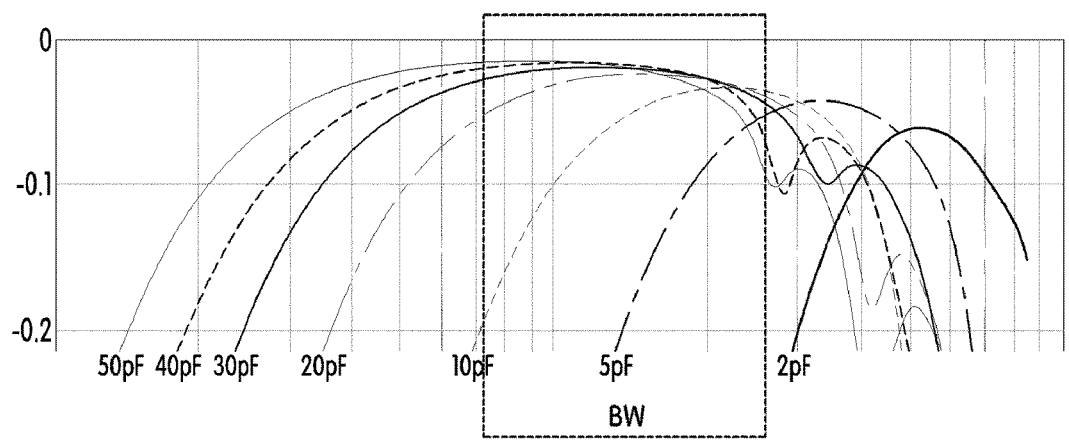
FIG. 14 is an enlarged view illustrating the pass frequency band in FIG. 13.

Here, a capacitance of the capacitor layer is preferably set so as to allow the communication signal of a main wireless communication band to pass without attenuation. As illustrated in FIGS. 13 and 14. According to the result of simulation the pass frequency band based on capacitances, a communication signal is transmitted with substantially no loss in the mobile wireless communication frequency band (700 MHz to 2.6 GHz) for a capacitance of 5 pF or more, resulting in an electrically short circuit phenomenon.

However, as illustrated in FIG. 14, looking at the subtle effects, it can be confirmed that the reception sensitivity is hardly affected by the communication at a capacitance of about 30 pF or more, thereby the capacitance of the capacitor layer in the mobile wireless communication frequency band preferably uses a high capacitance of 30 pF or more.

As a result, the electric shock protection device 120 may pass the communication signal flowing through the conductive connection part 110 from the conductor 12 by the high capacitance of the capacitor layer, without attenuation.

As illustrated in FIGS. 2, 3, 5, and 6, the circuit board 130 is provided with pads 131a to 131c. 133 and 134 and wirings 132 such that the conductive connection part 110 and the electric shock protection device 120 are electrically connected in series. Here, the pads 131a to 131c for the conductive connection part 110 and the pads 133 and 134 for the electric shock protection device 120 may be provided so that the conductive connection part 110 and the electric shock protection device 120 are double stacked.

That is, the circuit board 130 is provided with pads 131*a* to 131*c* corresponding to the shape of the lower surface 114 of the conductive connection part 110 for mounting the conductive connection part 110, and pads 133 and 134 corresponding to the shape of an external electrode of the electric shock protection device 120 for mounting the electric shock protection device 120.

In the case, when the conductive connection part 110 and the electric shock protection device 120 are separately disposed on the circuit board 130, that is, in FIGS. 2 and 3, a wiring 132 for connecting the conductive connection part 110 and the electric shock protection device 120 in series may be provided between the pads 131*a* and 131*b* for the conductive connection part and the pad 133 for the electric shock protection device.

Figure 15:
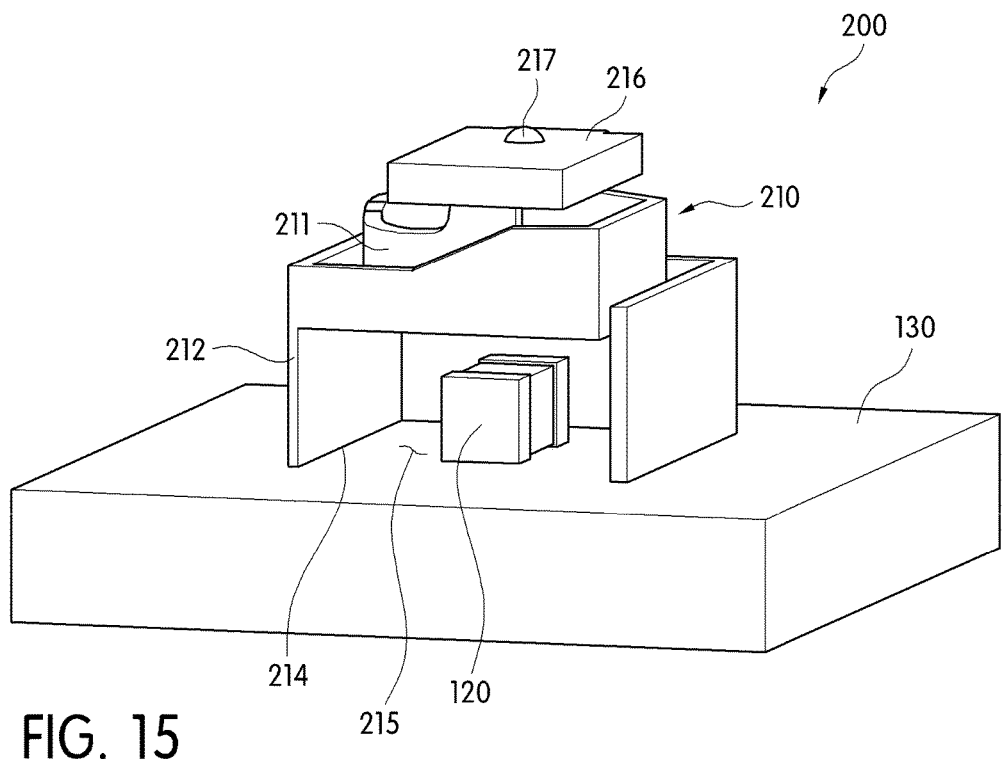
FIG. 15 is a perspective view illustrating another embodiment of an electric shock protection apparatus according to an embodiment of the present invention.

Meanwhile, in the present invention, the conductive connection part 210 may be configured such that elastic members having at least two different elastic forces share a space three-dimensionally. Here, as illustrated in FIG. 15, the at least two elastic members may be formed in a spiral shape. That is, the at least two elastic members may be configured to have different shapes and heights so as not to overlap each other spatially.

In this case, the spiral shape may be realized by folding an elastic member by folding or the like. Further, the spiral shape may be realized by rolling, winding, or the like of the elastic member. However, the implementation methods of the spiral shape are not limited thereto, and may be provided in different manners for each elastic member.

The conductive connection portion 210 includes a body 211, a supporting portion 212, and a cover part 216.

The body 211 is in that the elastic member is formed in a spiral shape. That is, as illustrated in FIG. 15, the body 211 is in that at least two elastic members are formed in a spiral shape from the lower portion to the upper side with respect to the central axis of the body 211, and the elastic members are formed in different shapes so as to share a space three-dimensionally. Therefore, when a conductor or the like is pressed on the upper side of the body 211, the body 211 is pressed downward by the elastic force and double spiral structure of the elastic member, and when the conductor is removed from the upper side, That is, it is restored to the upper side, the body 211 is restored to an original state, that is, to the upper side of the body 211 by the elastic force of the elastic member.

The supporting part 212 extends vertically downward from the body 211 and forms a predetermined space. Here, as the predetermined space is an accommodation part 215 for receiving the electric shock protection device 120 and the supporting portion 212 forms a side wall of the accommodation part 215. In this case, the accommodation part 215 is for double laminating the conductive connection part 210 and the electric shock protection device 120 on the circuit board 130 and accommodates at least a portion of the electric shock protection device 120.

The cover part 216 is connected to the upper portion of the body 211, and is configured to cover at least a portion of the body 211. The cover part 216 is provided with a contact part 217 for electrically contacting the conductor of the portable electronic device formed upward from the center thereof.

In this case, the conductive connection part 210 may include the accommodation part 215 variously according to a double stacked structure with the electric shock protection device 120.

For example, the accommodation part 215 may be provided in a shape of a letter "⊏" at a lower portion of the conductive connection part 210. That is, a side wall of the accommodation part 215 may be formed by a supporting part 212 extending vertically in a shape of a letter "⊏" at the lower portion of the conductive connection part 210. Here, the lower surface 214 of the conductive connection part 210 may be provided in a shape of a letter "⊏" and be mounted on the circuit board 130 (refer to FIG. 2).

In addition, the accommodation part 215 may be provided in a shape of a letter "⌷" in a lower portion of the conductive connection part 210. That is, a side wall of accommodation part 215 may be formed by a supporting part 212 extending vertically a shape of a letter "⌷" at the lower portion of the conductive connection part 210. In this case, a lower surface 214 of the conductive connection part 210 may be provided in a shape of a letter "⌷", and be mounted on the circuit board 130 (refer to FIG. 3).

With this configuration, the conductive connection part 210 and the electric shock protection device 120 may be double stacked on the circuit board 130 without a separate space for the electric shock protection device 120 to be miniaturized.

Figure 16:
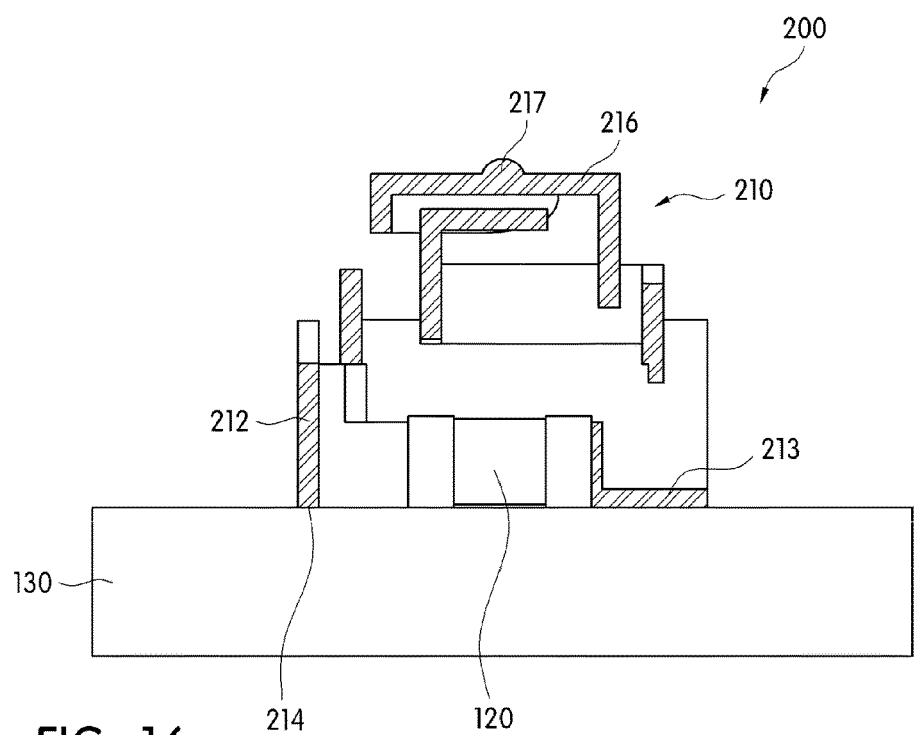
FIG. 16 is a cross-sectional view illustrating an electric shock protection apparatus according to another embodiment of the present invention, in which an electric shock protection device is double-stacked inside a contactor, and an electric shock protection device and a contactor are coupled.

In this case, as illustrated in FIG. 16, the conductive connection part 210 and the electric shock protection device 120 may be configured to be directly connected to each other. That is, an extension part 213 may be formed on the body 211 of the conductive connection part 210 toward the electric shock protection device 120 and the electric shock protection device 120 may be disposed to be completely stacked with the conductive connection part 210. Here, the connection part 213 may be provided to face one of the external electrodes 123 of the electric shock protection device 120.

In addition, the accommodation part 115 may be provided in a shape of a letter "E" in a lower portion of the conductive connection part 110. That is, a side wall of accommodation part 115 may be formed by a supporting part 112 extending vertically a shape of a letter "E" at the lower portion of the conductive connection part 110. In this case, an extension part 135 may be formed from a side of the supporting part 112 to the electric shock protection device 120. Here, a lower surface 114 of the conductive connection part 110 may be provided in a shape of a letter "E", and be mounted on the circuit board 130 (refer to FIG. 5).

In addition, the accommodation part 215 may be provided in a shape of a letter "⌷" at a lower portion of the conductive connection part 210, and an extension part may be provided in which a side of the shape of the letter "⌷" extends to the electric shock protection device 120.

That is, a side wall of the accommodation part 215 may be formed by a supporting part 212 extending vertically in a shape of a letter "⌷" at the lower portion of the conductive connection part 210, an extension part extended from a side of the side wall to the electric shock protection device 120 may be formed. Such an extension part may be provided to be electrically connected to the electric shock protection device 120. Here, a lower surface 214 of the conductive connection part 210 may be formed in a shape of a letter "⌷", and may be mounted on the circuit board 130 (refer to FIG. 6).

Hereinafter, an example of an electric shock protection device of an electric shock protection apparatus according to an embodiment of the present invention will be described in more detail with reference to FIGS. 17 to 22.

Figure 17:
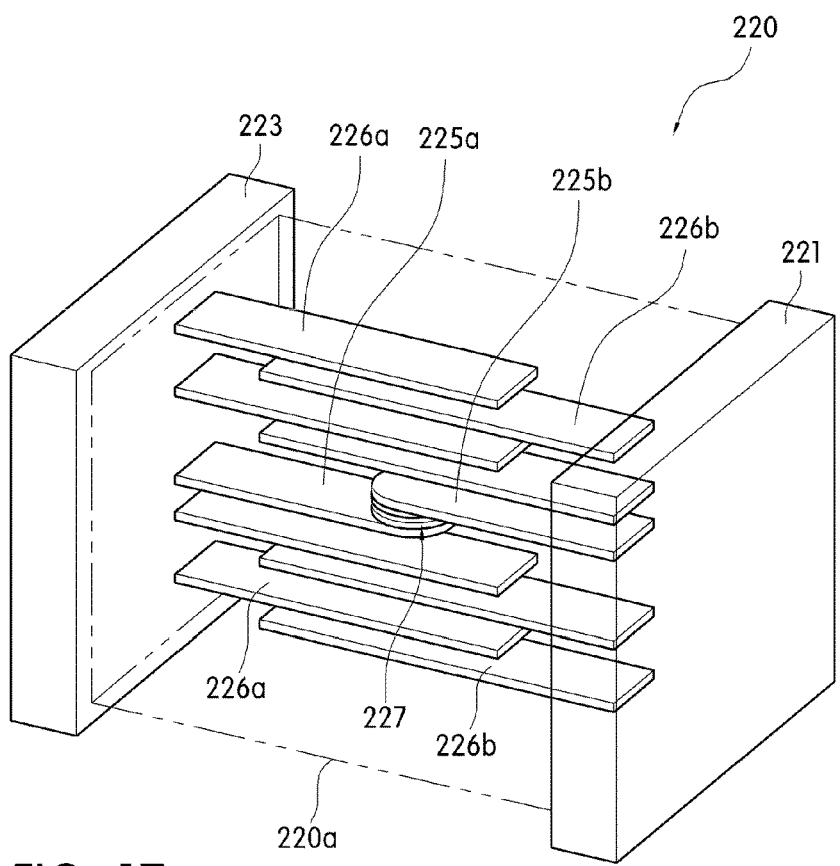
FIG. 17 is an external perspective view illustrating an embodiment of an electric shock protection device of an electric shock protection apparatus according to an embodiment of the present invention.
Figure 18:
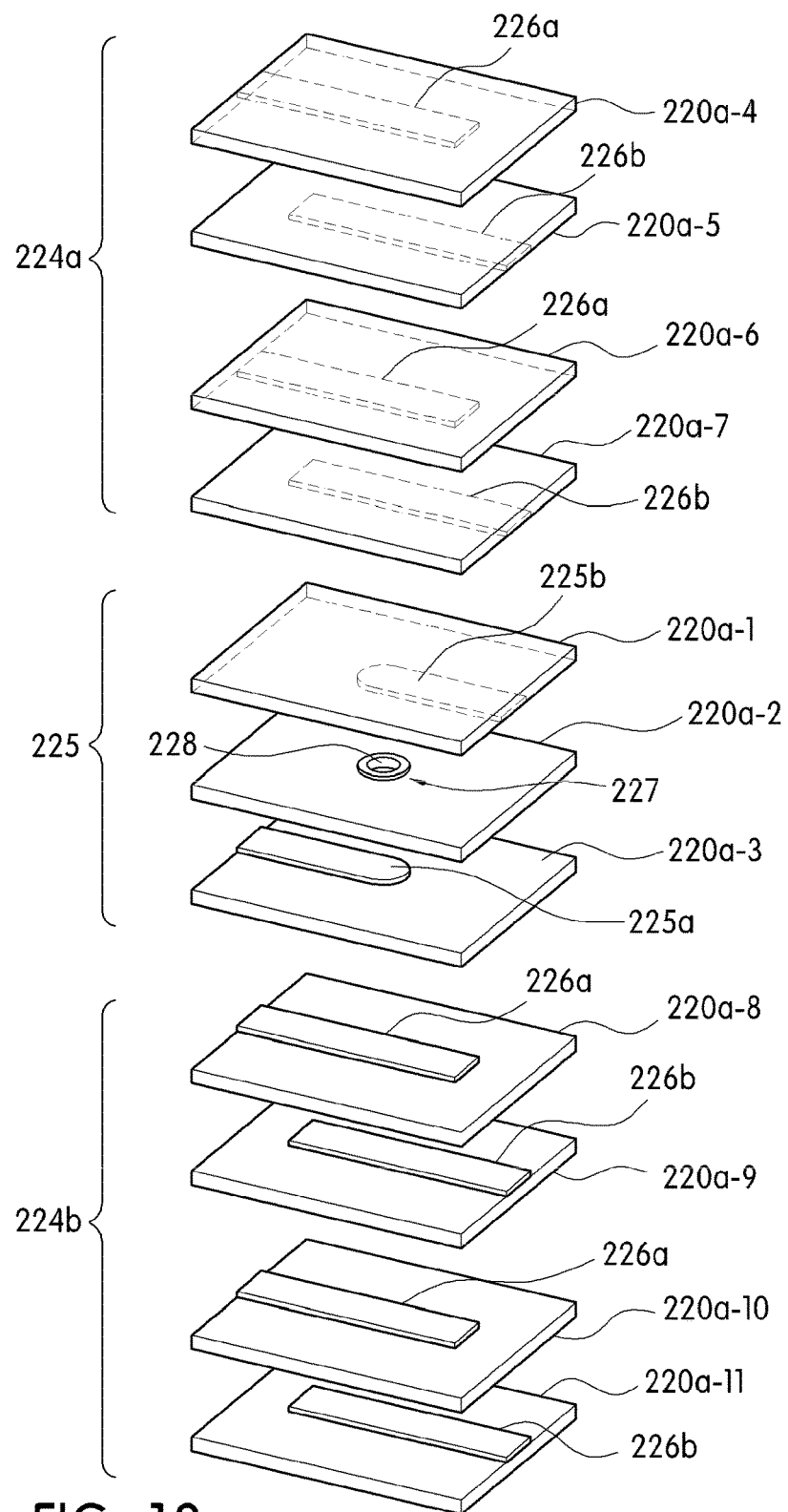
FIG. 18 is an exploded perspective view illustrating a stacking relationship of a plurality of sheet layers in FIG. 17.
Figure 19:
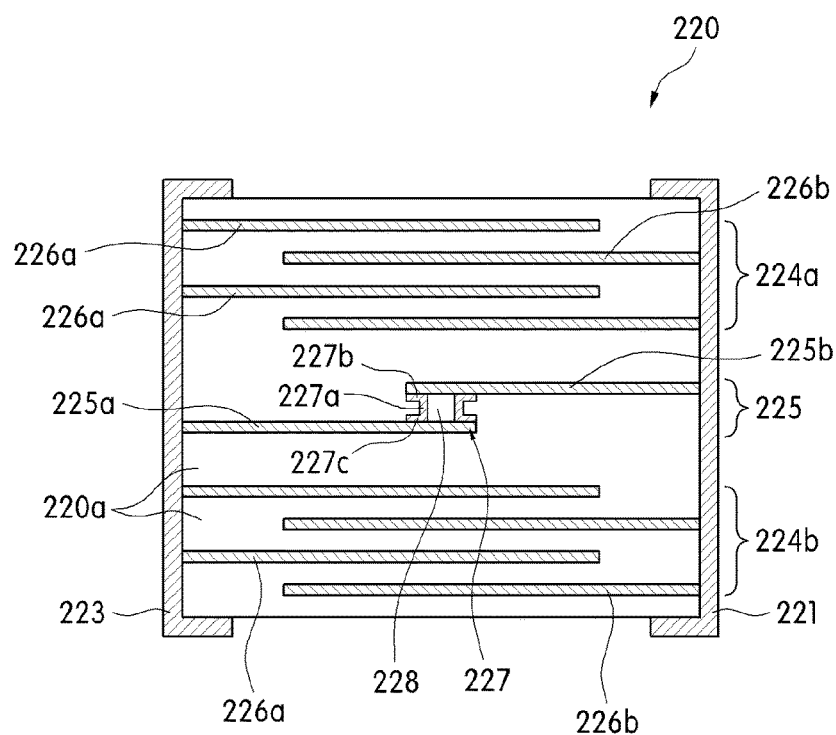
FIG. 19 is a longitudinal sectional view illustrating an electric shock protection device in FIG. 17.

As illustrated in FIGS. 17 to 19, an electric shock protection device 220 includes a sintered body 220*a*, an electric shock protection part 225, and a plurality of capacitor layers 224a and 224b. Here, the electric shock protection part 225 may include a pair of internal electrodes 225a and 225b and a pore 228. The capacitor layers 224a and 224b may include a plurality of capacitor electrodes 226a and 226b.

In this case, the sintered body 220a is in that to configure the electric shock protection device 220 and the capacitor layers 224a and 224b, a plurality of sheet layers 220a-1 to 220b-11 including electrodes 225a, 225b, 226a, and 226b are sequentially stacked on at least a portion of one surface thereof, and the sintered body 220a is formed integrally through at least a process of pressing, firing and curing after a plurality of electrodes provided on each surface are disposed to face each other.

Such a sintered body 220a may be formed of an insulator having permittivity. For example, the insulator may be formed of at least one of a ceramic material, a low temperature Co-fired ceramics (LTCC), a high temperature Co-fired ceramics (HTCC), and a magnetic material. In this case, the ceramic material may be a metal-oxide compound and the metal-oxide compound may include at least one kind selected of $Er_2O_3$, $Dy_2O_3$, $Ho_2O_3$, $V_2O_5$, $CoO$, $MoO_3$, $SnO_2$, $BaTiO_3$, and $Nd_2O_3$.

Each of the plurality of sheet layers 220a-1 to 220a-11 forming the sintered body 220a is in that any electrodes of the internal electrodes 225a and 225b forming the electric shock protection part 225 or the capacitor electrodes 226a and 226b forming the capacitor layers 224a and 224b may be formed. For example, the sheet layers 220a-1 and 220a-4 to 220a-7 of the upper side may be in that the internal electrodes 225a and 225b and the capacitor electrodes 226a and 226b are formed on the lower surface of the sheet layer corresponding to thereof, and the sheet layers 220a-2, 220a-3, and 220a-8 to 220a-11 of the lower side may be in that the internal electrodes 225a and 225b and the capacitor electrodes 226a and 226b are formed on the upper surface of the sheet layer corresponding to thereof.

Here, the electric shock protection device 220 may further include a pair of external electrodes 221 and 223 to which both ends of the electric shock protection part 225 and the capacitor layers 224a and 224b are electrically connected respectively such that the electric shock protection part 225 and the capacitor layers 224a and 224b are electrically connected in parallel. The external electrodes 221 and 223 may be provided on both sides of the sintered body 220a.

In this case, for the electric shock protection device 120 to be electrically connected to the conductive connection part 110 in series, the external electrode 221 is directly connected to the conductive connection part 110 on the circuit board 130 or is mounted on the pad 133 for the electric shock protection device connected to the pad 131a for the conductive connection part through the wiring 132, and the external electrode 223 is mounted on the pad 134 for the electric shock protection device separated to face the pad 133 for the electric shock protection device.

The internal electrodes 225a and 225b are spaced apart from each other within the sintered body 220a. The internal electrodes 225a and 225b may include any one component or more of Ag, Au, Pt, Pd, Ni, and Cu, the external electrodes 221 and 223 may include any one component or more of Ag, Ni, and Sn.

In this point, the pair of internal electrodes 225a and 225b facing each other may be provided in various shapes and patterns, the internal electrode 225a and the internal electrode 225b may be provided in the same pattern or may be provided to have different patterns. That is, in a case of forming the sintered body 220a, the internal electrodes 225a and 225b are not limited to a specific pattern when the internal electrodes are disposed to overlap with each other.

Here, the intervals between the internal electrodes 225a and 225b and the areas facing each other or overlap length with each other may be configured to satisfy the breakdown voltage Vbr of the electric shock protection device 220. The interval between the internal electrodes 225a and 225b may be 10 to 100 µm.

The pore 228 may be formed by, for example, a pore-forming member 227. That is, as illustrated in FIG. 19, each of the pore-forming members 227 may be inserted between the pair of internal electrodes 225a and 225b in the sintered body 220a. That is, the pore-forming member 227 may be provided in the sheet layer 220a-2 in the electric shock protection part 225 and may be exposed above and below the sheet layer 220a-2 so as to be in contact with the internal electrodes 225a and 225b.

In this case, the pore-forming member 227 may include discharging material layers 227a, 227b, and 227c applied to the inner wall of the pore-forming member 227 at a predetermined thickness along the height direction. Here, the discharging material constituting the discharging material layers 227a, 227b and 227c must have a low permittivity, no conductivity, and no short circuit when an overvoltage is applied.

For this above, the discharging material may be formed of a non-conductive material including at least one kind of metal particles, and may be formed of a semiconductor material including SiC or a silicon-based component.

For example, when the internal electrodes 225a and 225b include an Ag component, the discharging material may include a SiC—ZnO-based component. The silicon carbide (SiC) component has excellent thermal stability, excellent stability in an oxidizing atmosphere, constant conductivity and heat conductivity, and permittivity. And the ZnO component has excellent nonlinear resistance property and discharging property.

In addition, both of SiC and ZnO have conductivity when used separately, but when they are mixed and fired. ZnO is bonded to the surface of SiC particles and forms an insulating layer having low conductivity.

In such an insulating layer, SiC completely reacts and forms a SiC—ZnO reaction layer on the surface of the SiC particles. Accordingly, the insulating layer may provide a further higher insulating property to the discharging material block the Ag path and improve the resistance to static electricity, thereby solve the DC shorting phenomenon when the electric shock protection apparatus 100 is mounted on the electronic component.

Here, although it is described that the present invention includes in the context of a SiC—ZnO-based material as an example of the discharging material, it is not limited thereto, the discharging material is in that a non-conductive material including a semiconductor material or metal particles suitable for the components constituting the internal electrodes 225a and 225b may be used.

In this case, the discharging material layer applied to the inner wall of the pore-forming member 227 may include a first portion 227a applied along the inner wall of the pore-forming member 227, a second portion 227b extended from the upper end of the first portion 227a to face and be in contact with the internal electrode 225a, and a third portion 227c extended from the lower end of the first portion 227a to face and be in contact with the internal electrode 225c.

Through this above, since the second portion 227b and the third portion 227c is formed to be extended from the inner wall of the pore-forming member 227 as well as the upper and lower ends of the pore-forming member 227, respectively, the discharging material layers 227a, 227b and 227c may increase a contact area with the internal electrode 225a and the internal electrode 225c.

In this way, this is to enhance the resistance to static electricity, so that the discharging material layers serve to perform their function, even if a portion of the component constituting the discharging material layers 227a, 227b, and 227c are vaporized by the electrostatic spark due to the overvoltage and thus a portion of the discharging material layers 227a, 227b, and 227c are damaged.

The pore 228 may be formed between the pair of internal electrodes 225a and 225b by the pore-forming member 227. The static electricity flows from the outside by the pore 228 may be discharged between the pair of internal electrodes 225a and 225b. In this case, the electrical resistance between the pair of the internal electrodes 225a and 225b is lowered and the voltage difference between both ends of a connector 200 for the electric shock protection may be reduced to a predetermined value or less. Therefore, the electric shock protection device 220 may pass the static electricity without internal dielectric breakdown.

Meanwhile, a plurality of the pore-forming members 227 may be provided between the pair of internal electrodes 225a and 225b. As described above, when the number of the pore-forming members 227 disposed between the pair of internal electrodes is increased, the discharge path of static electricity is increased, so that resistance to static electricity may be increased.

The capacitor layers 224a and 224b may be at least one stacked capacitor layer configured to pass communication signals flows from the conductor 12. The capacitor layers 224a and 224b may be electrically connected in parallel to the electric shock protection part 225 through the external electrodes 221 and 223. For example, one or both of the upper portion and lower portion of the electric shock protection part 225, and may be provided with a plurality of capacitor electrodes 226a and 226b.

The capacitor layers 224a and 224b are intended to improve RF reception sensitivity by providing additional capacitance of the electric shock protection device 120.

With such capacitor layers 224a and 224b, unlike the conventional technique in which a separate component for increasing the RF reception sensitivity is used together with a suppressor, a varistor or a Zener diode for protecting the internal circuit against static electricity, an electric shock protector has the advantage of increasing the RF reception sensitivity as well as the protecting against static electricity.

Meanwhile, it is preferable that the interval between the electric shock protection part 225 and the capacitor layers 224a and 224b are larger than the interval between the internal electrodes 225a and 225b or the interval between the capacitor electrodes 226a and 226b. That is, it is preferable to secure a sufficient distance between the capacitor electrodes 226a and 226b and the internal electrodes 225a and 225b closest to the electric shock protection part 225 in the capacitor layers 224a and 224b so that static electricity or leakage current flowing along the internal electrodes 225a and 225b does not leak to the adjacent capacitor electrodes 226a and 226b.

Here, a sheet layer on which the electric shock protection part 225 and the upper and lower capacitor layers 224a and 224b are formed may be formed of the same material, but may be selectively formed of different heterogeneous materials.

Further, at least one of the plurality of sheet layers 220a-4 to 220a-11 constituting the capacitor layers 224a and 224b may use a first ceramic material, and the remaining sheet layers may use a second ceramic material.

In this case, the first ceramic material and the second ceramic material may be heterogeneous ceramic materials. Here, the meaning of 'heterogeneous' means that the chemical formulas are different from each other or the physical properties are mutually different even if the chemical formulas are the same.

Figure 20:
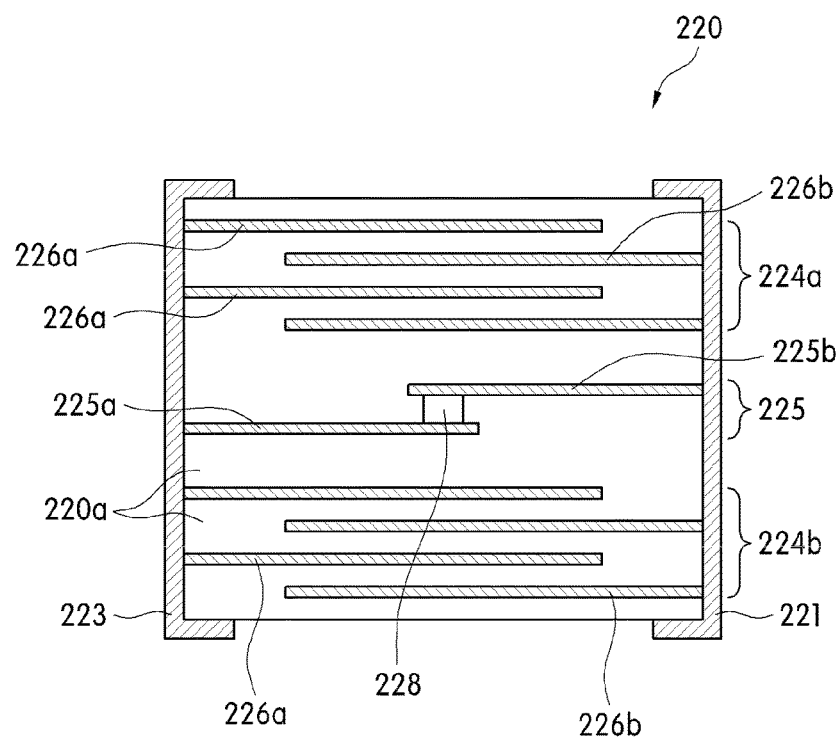
FIGS. 20 to 22 are longitudinal sectional views illustrating various forms of an electric shock protection part in an embodiment of an electric shock protection device of an electric shock protection apparatus according to an embodiment of the present invention.

As another example, as illustrated in FIG. 20, an electric shock protection device 220 is in that a pore 228 may be formed between the pair of internal electrodes 225a and 225b without using a separate pore-forming member. For this above, the sheet layer 220a-2 may be provided with a through hole at a position corresponding to the pore 228.

In this case, a filling layer formed of a discharging material may be disposed in the through hole formed in the sheet layer 220a-2. In addition, the pore 228 may have a discharging material layer on the side wall thereof. The discharging material layer may be applied to the inner wall of the through hole formed in the sheet layer 220a-2 with a predetermined thickness along the height direction.

Figure 21:
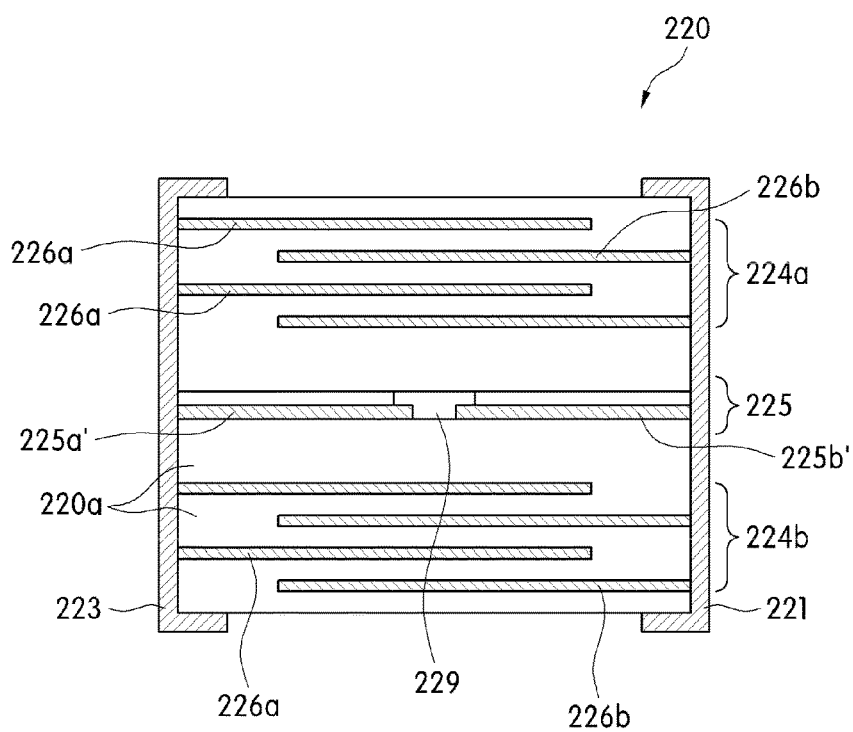

As another example, as illustrated in FIG. 21, the electric shock protection device 220 may include internal electrodes 225a' and 225b' horizontally spaced apart from each other by a predetermined interval. That is, the electric shock protection device 220 may include a horizontal electrodes formed on the same sheet layer.

In this case, a pore 229 may be formed between the pair of internal electrodes 225a' and 225b'. Here, the pore 229 may be formed to have a height larger than the height of the internal electrodes 225a' and 225b' and may be formed to have a width larger than the interval between the internal electrodes 225a' and 225b'. As described above, when the volume of the pore 229 is enlarged, even if fine particles are generated from the internal electrodes 225a' and 225b' during discharging by static electricity, the space between the internal electrodes 225a' and 225b' is wide, so that the incidence of defects that can be caused by the particles may be reduced.

Here, as the pore 229 is a space in which a discharge is started by a pair of internal electrodes 225a' and 225b' upon flowing of static electricity, and the volume of the pore 229 is preferably set so as to satisfy the immunity against static electricity. For example, the volume of the pore 229 may be 1 to 15% of the total volume of the electric shock protection device 200.

Figure 22:
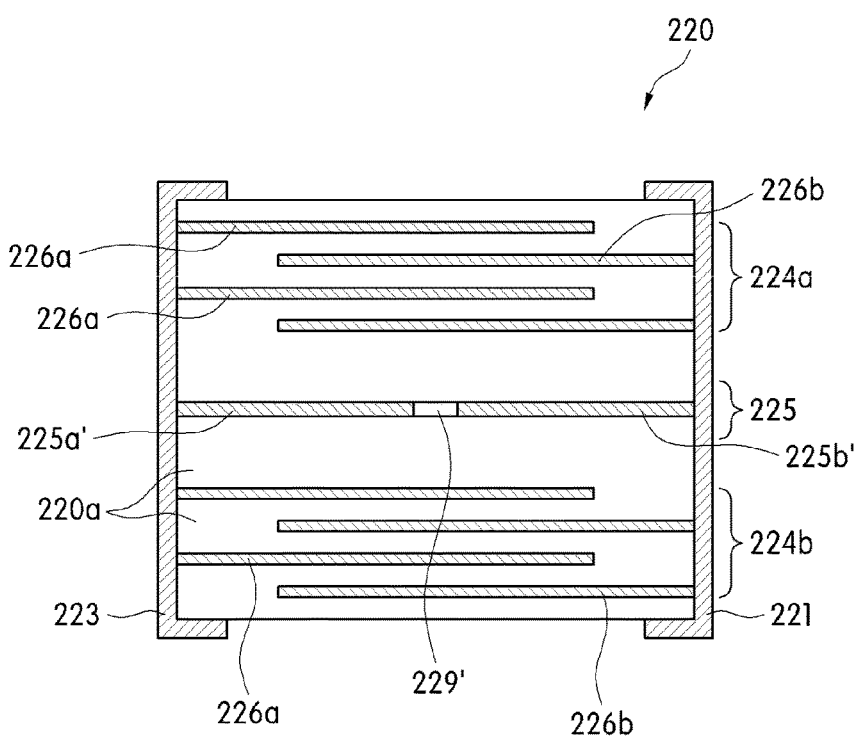

As illustrated in FIG. 22, the electric shock protection device 220 is in that internal electrodes 225a' and 225b' are disposed on the same sheet layer so as to be spaced apart from each other, and a pore 229' formed between the internal electrodes may be formed in the form of a through hole.

That is, the through hole may be disposed between a pair of internal electrodes 225a' and 225b' arranged in parallel on the same sheet layer, and may be provided in a hollow shape so as to fill the air.

In this case, the electric shock protection device 220 may include a discharging material layer on a sidewall of the pore. The discharging material layer may be applied to the inner wall of the through hole formed in the sheet layer 220a-2 with a predetermined thickness along the height direction. In addition, the electric shock protection device 220 is in that a filling material formed of a discharging material may be disposed in the through hole formed in the sheet layer 220a-2.

Figure 23:
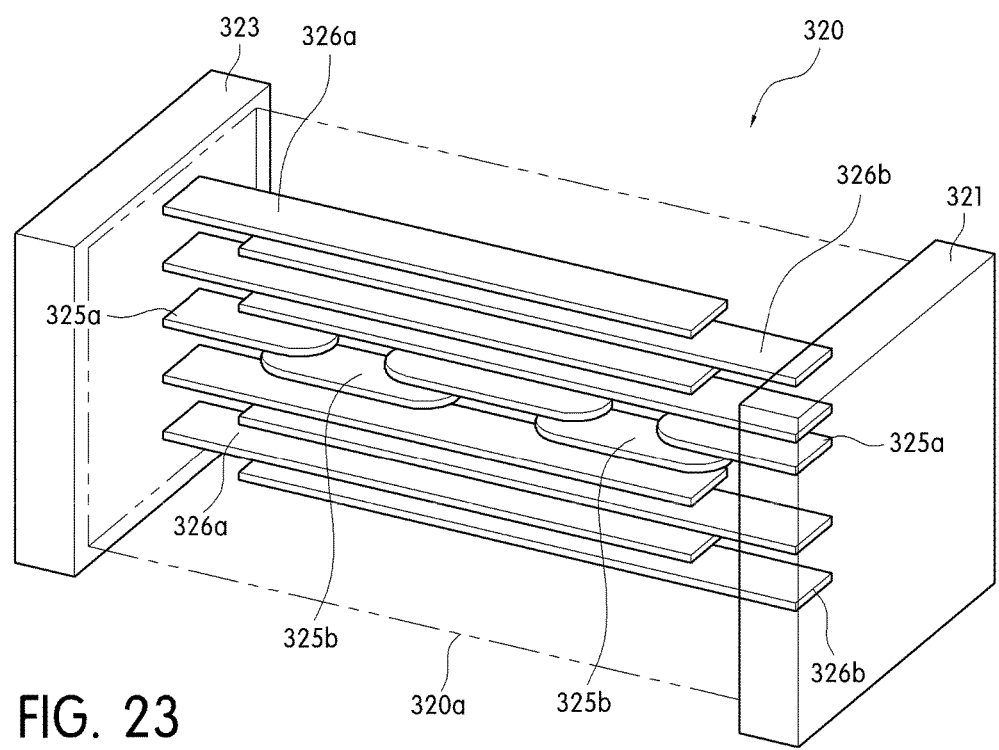
FIG. 23 is an external perspective view illustrating another embodiment of an electric shock protection device of an electric shock protection apparatus according to an embodiment of the present invention.

Hereinafter, another example of an electric shock protection device of an electric shock protection apparatus according to an embodiment of the present invention will be described in more detail with reference to FIGS. 23 to 25.

The electric shock protection device 320 includes an electric shock protection part 325, and the capacitor layers 324a and 324b. The electric shock protection part 325 may include varistor material layers 320a-1 and 320a-2 and internal electrodes 325a and 325b, and the capacitor layers 324a and 324b may include a plurality of capacitor electrodes 326a and 326b.

Such an electric shock protection device 320 includes a plurality of sheet layers 320a-1 to 320a-11, each of the plurality of sheet layers 320a-1 to 320a-11 is in that any one electrodes may be formed of the internal electrodes 325a and 325b constituting the electric shock protection part 325 and the capacitor electrodes 326a and 326b constituting the capacitor layers 324a and 324b. For example, the intermediate sheet layers 320a-1 to 320a-2 are in that the internal electrodes 325a and 325b may be formed on the upper surface of the corresponding sheet layer, the sheet layers 220a-4 to 220a-7 of the upper side are in that the capacitor electrodes 326a and 326b may be formed on the upper surface of the corresponding sheet layer, and the sheet layers 220a-8 to 220a-11 of the lower side are in that the capacitor electrodes 326a and 326b may be formed on the upper surface of the corresponding sheet layer.

The electric shock protection device 320 may further include a pair of external electrodes 321 and 323 to which both ends of each of the electric shock protection part 325 and the capacitor layers 324a and 324b are electrically connected so as to be electrically connected the electric shock protection part 325 and the capacitor layers 324a and 324b. The external electrodes 321 and 323 may be provided on both sides of the plurality of sheet layers 320a-1 to 320a-11.

In this case, the varistor material layer may formed of at least two layers of alternating a first varistor material layer 320a-1 and a second varistor material layer 320a-2. Here, the first varistor material layer 320a-1 and the second varistor material layer 320a-2 may be provided by a semiconductive material including at least one of $ZnO$, $SrTiO_3$, $BaTiO_3$, and $SiC$, or may be provided by any one of Pr and Bi-based materials. In addition, it is preferable that the varistor material layer is set so that the particle diameter of the varistor material satisfies the breakdown voltage.

The internal electrodes 325a and 325b may include a plurality of first internal electrodes 325a spaced apart by a predetermined interval L on the first varistor material layer 320a-1 and a plurality of second internal electrodes 325b spaced apart by a predetermined interval L on the second varistor material layer 320a-2.

Here, the breakdown voltage Vbr of the electric shock protection device 320 may be the sum of unit breakdown voltages formed between the first internal electrodes 325a and second internal electrode 325b. That is, the breakdown voltage Vbr of the electric shock protection device 320 may be determined according to the unit breakdown voltage formed between each of the first internal electrode 325a and the second internal electrode 325b and the number of the first internal electrode 325a and the second internal electrode 325b which are electrically connected in series.

In this case, each of the first internal electrode 325a and the second internal electrode 325b may be disposed so as not to be overlapped at least a portion of the first internal electrode 325a and the second internal electrode 325b. That is, each of the first internal electrode 325a and the second internal electrode 325b may be disposed in an intersecting manner so as to be overlapped at least a portion of the electrodes, or may be disposed between each other so as not to be overlapped at least a portion of the electrodes.

Here, the number of the first internal electrode 325a and the second internal electrode 325b may be determined so as to satisfy the breakdown voltage Vbr of the electric shock protection device 320. depending to the unit breakdown voltage formed between thereof. That is, in FIG. 25, it is described that there are four unit elements formed by the first internal electrode 325a and the second internal electrode 325b, but it is not limited thereto, the number of unit elements formed by the first internal electrode 325a and the second internal electrode 325b may be formed in a plurality according to the size of unit breakdown voltage.

In this case, the electric shock protection part 325 is in that a plurality of unit elements formed by the first internal electrode 325a and the second internal electrode 325b may be provided in parallel. That is, the electric shock protection portion 325 may be formed by alternately stacking the first varistor material layer 320a-1 formed a first internal electrode 325a and the second varistor material layer 320a-2 formed a second internal electrode 325b.

Meanwhile, in the first internal electrode or the second internal electrode, it is preferable that the interval is set so that the static electricity or the leakage current does not leak to the adjacent positions of the internal electrodes 325a and 325b but can progress normally between the internal electrodes 325a and 325b.

For example, It is preferable that the interval L between one first internal electrode 325a and another neighboring first internal electrode 325a is formed to be larger than the shortest distance dl between the first internal electrode 325a and the second internal electrode 325b.

In addition, in the first internal electrode or the second internal electrode, it is preferable that the interval is set so that the static electricity or the leakage current does not leak to the adjacent positions of the internal electrodes 325a and 325b but can progress normally between the internal electrodes 325a and 325b.

In addition, it is preferable that the interval between the electric shock protection part 325 and the capacitor layers 324a and 324b are larger than the interval between the internal electrodes 325a and 325b or the interval between the capacitor electrodes 326a and 326b. That is, it is preferable to secure a sufficient distance between the capacitor electrodes 326a and 326b and the internal electrodes 325a and 325b closest to the electric shock protection part 325 in the capacitor layers 324a and 324b so that static electricity or leakage current flowing along the internal electrodes 325a and 325b does not leak to the adjacent capacitor electrodes 326a and 326b.

The capacitor layers 324a and 324b may be at least one stacked capacitor layer configured to pass communication signals. The capacitor layers 324a and 324b may be electrically connected in parallel with an electric shock protection part, for example, may be formed on the upper or lower portion of the electric shock protection part, and may include the capacitor electrodes 326a and 326b.

Here, a plurality of sheet layers 320a-3 to 320a-11 forming the capacitor layers 324a and 324b may be formed of an insulator having permittivity, for example, a ceramic material. In this case, the ceramic material may be a metal-oxide compound and the metal-oxide compound may include at least one kind selected of $Er_2O_3$, $Dy_2O_3$, $Ho_2O_3$, $V_2O_5$, $CoO$, $MoO_3$, $SnO_2$, and $BaTiO_3$. Meanwhile, the upper capacitor layer 324a and the lower capacitor layer 324b are formed may be formed of the same material, but may be selectively formed of different heterogeneous materials.

Hereinafter, examples of various implementations of conductive connections in an electric shock protection apparatus according to an embodiment of the present invention will be described in more detail with reference to FIGS. 26 to 29.

As illustrated in FIG. 26, the electric shock protection apparatus is a case in which a conductive connection unit is a clip-shaped conductor 310, the clip-shaped conductor 310 includes a contact portion 311, an bent part 312, and a terminal portion 313.

The contact portion 311 has a curved shape and may be electrically in contact with the conductor 12. The bent part 312 may be extended from the contact portion 311 and may have an elastic force. The terminal portion 313 may include a terminal that is electrically connected to the electric shock protection devices 220 and 320.

The contact portion 311, the bent part 312, and the terminal portion 313 may be formed of a conductive material having an elastic force in one piece.

As illustrated in FIG. 27, the electric shock protection apparatus is a case in which the conductive connection part is a box-shaped silicone rubber pad 410, and the silicone rubber pad includes a body 411 and a conductive wire 412.

The body 411 may be formed of silicone rubber, and the upper portion thereof may be in surface contact with the conductor 12 such as an antenna or a metal housing, and the lower portion thereof may be electrically connected to the electric shock protection devices 220 and 320.

The conductive wire 412 may be vertically formed inside the body 411. This conductive wire 412 is intended to complement the elastic force of the body 411 while improving electrical contact with the conductor 12.

For example, when the conductive wire 412 is pressed by the conductor 12, the upper end thereof is bent downward, when the conductor 12 is removed, the body 411 is restored to original vertical state thereof, so that the elastic force of the body 411 may be compensated.

Alternatively, a box-shaped conductive connection part may be a conductive gasket. Here, the conductive gasket may be integrally formed of a conductive material having an elastic force. Such a conductive gasket may include, for example, at least one of a polymer body in which conductive paste is formed by thermocompression bonding, natural rubber, sponge, synthetic rubber, foam, heat-resistant silicone rubber and tube. The conductive gasket is not limited thereto and may include a conductive material having an elastic force.

This conductive gasket or silicone rubber pad 410 may be in surface contact with a conductor 12 such as a metal housing or an antenna and may be electrically connected in series with the electric shock protection devices 220 and 320 through the circuit board 130.

Figure 28:
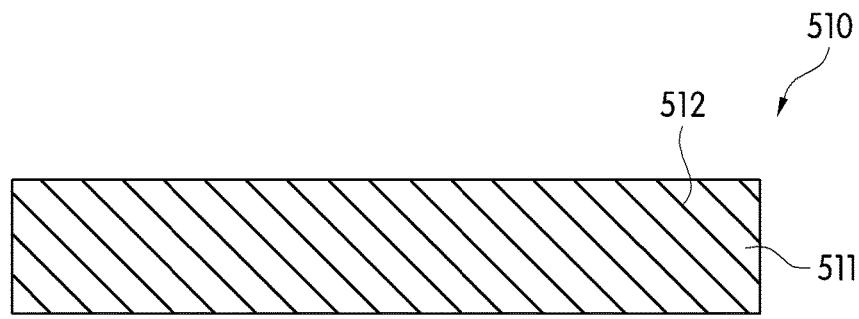

As illustrated in FIG. 28, the electric shock protection apparatus is a case in which the conductive connection part is a silicone rubber pad 510, and the silicone rubber pad 510 includes a body 511 and a conductive wire 512.

The body 511 may be formed of silicone rubber, and the upper portion thereof may be in surface contact with the conductor 12 such as an antenna or a metal housing, and the lower portion thereof may be electrically connected to the electric shock protection devices 220 and 320 through the circuit board 130.

The conductive wire 512 may be obliquely formed inside the body 511. This conductive wire 512 is intended to complement the elastic force of the body 511 while improving electrical contact with the conductor 12.

For example, when the conductive wire 512 is pressed by the conductor 12, the upper end thereof is bent downward, when the conductor 12 is removed, the body 511 is restored to original vertical state thereof, so that the elastic force of the body 511 may be compensated. In this case, when the conductive wire 512 is slanted by the pressing force of the conductor 12, the contact with the conductor 12 becomes excellent, and consequently, the conductivity of the communication signal may be improved.

This conductive wire 512 may be excellent in the conductivity of the communication signal, good in the elastic restoring force, and excellent in long-term use, as compared with the vertically formed conductive wire 412 of FIG. 27 bent downward by the pressing force of the conductor 12.

Figure 29:
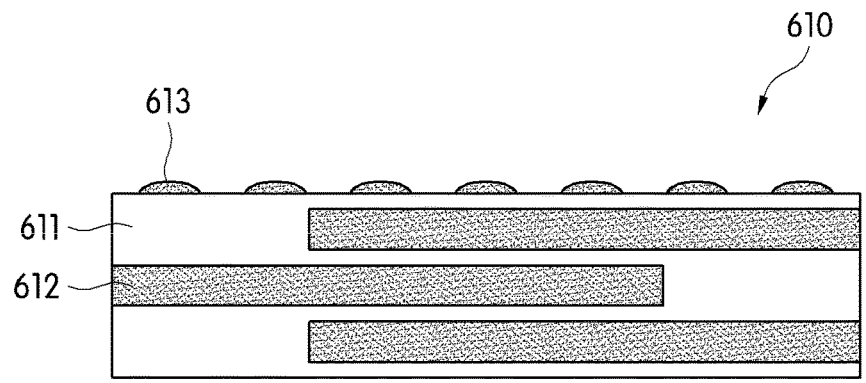

As illustrated in FIG. 29, the electric shock protection apparatus is a case in which the conductive connection part is a silicone rubber pad 610, the silicone rubber pad 610 includes a body 611, a conductive layer 612, and a contact portions 613.

The body 611 may be formed of a silicon rubber, and the bottom thereof may be electrically connected to electric shock protection devices 220 and 320.

The conductive layer 612 may be horizontally alternately stacked in the body 611 and may be a plurality of layers formed of a curable Ag paste. The conductive layer 612 is for supplementing the elastic force of the body 611 as well as improving electrical contact with the conductor 12.

For example, when the conductive layer 612 is pressed by the conductor 12, the center portion thereof may be pressed downward, and when the conductor 12 is removed, the conductive layer 612 is restored to original horizontal state thereof so that the elastic force of the body 611 may be supplemented. Therefore, the conductive layer 612 may have excellent elastic restoring force and may be used for a long period of time in comparison to the vertically formed conductive wire 412 of FIG. 27 which is bent downward by the pressing force of the conductor 12 or the obliquely formed conductive wire 512 of FIG. 28 which is slanted to the right and left sides.

The contact portions 613 may be formed in a curved protrusion shape on an upper side of the body 611. The contact portions 613 may increase a contact area with the conductor 12 by being in multiple line contact with or in surface contact with the conductor 12 such as an antenna or a metal housing. Therefore, the silicon rubber pad 610 may improve the transmission of the communication signal.

Although exemplary embodiments of the present disclosure have been described, the exemplary embodiments described in the specification are intended to not limit the technical spirit of the present disclosure, and A person having ordinary skills in the art who understands the spirit of the present disclosure should appreciate that another embodiment may be easily suggested by additions, modifications, deletions, supplements, and the like made within the scope of the same spirit, and the other embodiment also may be included within the scope and sprit of the present disclosure.

The invention claimed is:
1. An electric shock protection apparatus comprising:
   a conductive connection part having elastic force comprising an accommodation part which an upper surface is in electrical contact with a conductor of an electronic device and in which a predetermined space is formed at a lower portion;
   a circuit board on which the conductive connection part is mounted; and an electric shock protection device mounted on the circuit board such that at least a portion of the electric shock protection device is disposed at the accommodation part, and blocking a leakage current of an external power source that flows from a ground of the circuit board of the electronic device, wherein the circuit board comprises a pad and a wiring such that the conductive connection part and the electric shock protection device are electrically connected in series.

2. The electric shock protection apparatus of claim 1, wherein the electric shock protection device passes a communication signal flowing from the conductor or passes the static electricity without a dielectric breakdown when the static electricity flows from the conductor.

3. The electric shock protection apparatus of claim 1, wherein the accommodation part is provided in any one of a shape of a letter "⊏", a shape of a letter "E", and a shape of a letter "⊡" on a lower surface of the conductive connection part.

4. The electric shock protection apparatus of claim 1, wherein the accommodation part is provided in a shape of a letter "⊡" on a lower surface of the conductive connection part, and includes an connection part in which a side of the shape of the letter "⊡" extends to the electric shock protection device.

5. The electric shock protection apparatus of claim 1, wherein the accommodation part is formed between a plurality of supporting parts extending vertically from a lower surface of the conductive connection part.

6. The electric shock protection apparatus of claim 1, wherein the conductive connection part shares a space three-dimensionally with elastic members having at least two different elastic forces.

7. The electric shock protection apparatus of claim 1, wherein the conductive connection part including:
    a body including an elastic member having a spiral shape;
    a cover part including a contact part formed on the upper side of the body; and
    a supporting part extending vertically from the body and forming a side wall of the accommodation part.

8. The electric shock protection apparatus of claim 7, wherein the spiral shape is formed by one of folding, rolling, and winding.

9. The electric shock protection apparatus of claim 7, wherein the supporting part is provided in any one of a shape of a letter "⊏", a shape of a letter "E", and a shape of a letter "⊡" on a lower surface of the conductive connection part.

10. The electric shock protection apparatus of claim 7, wherein the supporting part is provided in a shape of a letter "⊡" on a lower surface of the conductive connection part, and includes an connection part in which a side of the shape of the letter "⊡" extends to the electric shock protection device.

11. The electric shock protection apparatus of claim 7, wherein the supporting part is respectively separated from a plurality of positions on the lower surface of the body and vertically extends.

12. The electric shock protection apparatus of claim 1, wherein the electric shock protection device includes an electric shock protection part and at least one capacitor layer,
    wherein the electric shock protection part has a breakdown voltage Vbr satisfying the following equation, $$Vbr > Vin, Vcp > Vbr$$

wherein, Vin is a rated voltage of an external power source of the electronic device, and Vcp is a total dielectric breakdown voltage of the capacitor layer.

13. The electric shock protection apparatus of claim 12, wherein the electric shock protection device including:
    a sintered body in which a plurality of sheet layers are stacked;
    an electric shock protection part including at least a pair of internal electrodes spaced apart from each other at a predetermined interval in inside of the sintered body; and
    at least one capacitor layer electrically connected in parallel with the electric shock protection part and passing a communication signal flowing from the conductor.

14. The electric shock protection apparatus of claim 12, wherein the electric shock protection device including:
    an electric shock protection part including at least two varistor material layers in which a first varistor material layer and a second varistor material layer are stacked, a plurality of first internal electrodes spaced apart by a predetermined interval L on the first varistor material layer, a plurality of second internal electrodes spaced apart by a predetermined interval L on the second varistor material layer, and
    at least one laminated capacitor layer electrically connected in parallel with the electric shock protection part and passing a communication signal.

15. The electric shock protection apparatus of claim 1, wherein the conductive connection part is any one of a conductive gasket, a silicone rubber pad, and a clip-shaped conductor having elastic force.

* * * * *